US008612794B2

(12) United States Patent
Kojima

(10) Patent No.: US 8,612,794 B2
(45) Date of Patent: Dec. 17, 2013

(54) CLOCK SIGNAL GENERATING DEVICE AND ELECTRONIC DEVICE

(75) Inventor: Jun Kojima, Tachikawa (JP)

(73) Assignees: Casio Electronics Manufacturing Co., Ltd., Saitama (JP); Casio Computer Co., Ltd., Tokyo (JP)

(*) Notice: Subject to any disclaimer, the term of this patent is extended or adjusted under 35 U.S.C. 154(b) by 436 days.

(21) Appl. No.: 12/957,667

(22) Filed: Dec. 1, 2010

(65) Prior Publication Data

US 2011/0138215 A1    Jun. 9, 2011

(30) Foreign Application Priority Data

Dec. 3, 2009  (JP) .................................. 2009-275571
Mar. 29, 2010  (JP) .................................. 2010-075712

(51) Int. Cl.
*G06F 1/08* (2006.01)

(52) U.S. Cl.
USPC ............ 713/501; 713/322; 327/105; 327/156

(58) Field of Classification Search
USPC .......................... 713/322, 501; 327/105, 156
See application file for complete search history.

(56) References Cited

U.S. PATENT DOCUMENTS

| 5,661,440 | A |   | 8/1997  | Osaka          |         |
|-----------|---|---|---------|----------------|---------|
| 5,706,315 | A | * | 1/1998  | Ogoro          | 375/344 |
| 6,144,239 | A | * | 11/2000 | Yonemori et al.| 327/158 |

FOREIGN PATENT DOCUMENTS

| JP | 62-048403   | B | 10/1987 |
|----|-------------|---|---------|
| JP | 5-090962    | A | 4/1993  |
| JP | 5-206848    | A | 8/1993  |
| JP | 5-211440    | A | 8/1993  |
| JP | 6-164387    | A | 6/1994  |
| JP | 7-086930    | A | 3/1995  |
| JP | 7-303042    | A | 11/1995 |
| JP | 08-023274   | A | 1/1996  |
| JP | 9-121158    | A | 5/1997  |
| JP | 9-261046    | A | 10/1997 |
| JP | 2000-068828 | A | 3/2000  |
| JP | 2000-278104 | A | 10/2000 |
| JP | 2004-242217 | A | 8/2004  |
| JP | 2005-311594 | A | 11/2005 |
| JP | 2009-206673 | A | 9/2009  |

OTHER PUBLICATIONS

Japanese Office Action dated Apr. 3, 2012 (and English translation thereof) in counterpart Japanese Application No. 2010-075712.
Japanese Office Action dated Nov. 8, 2011 (and English translation thereof) in counterpart Japanese Application No. 2009-275571.

* cited by examiner

*Primary Examiner* — Thuan Du
(74) *Attorney, Agent, or Firm* — Holtz, Holtz, Goodman & Chick, PC

(57) ABSTRACT

To provide a clock signal generating device that changes the frequency of a predetermined clock signal in a short time and prevents or mitigates instability in the operation of the supply destinations of the clock signal when the frequency of the clock signal is changing.
The clock signal generating device is provided with a second control unit that, when the target frequency changes, successively changes the voltage impressed on the clock signal generating unit with a preset change value and a preset interval in a preset time in place of the first control unit, causing the frequency of the clock signal newly generated by the clock signal generating unit to approach the target frequency.

21 Claims, 16 Drawing Sheets

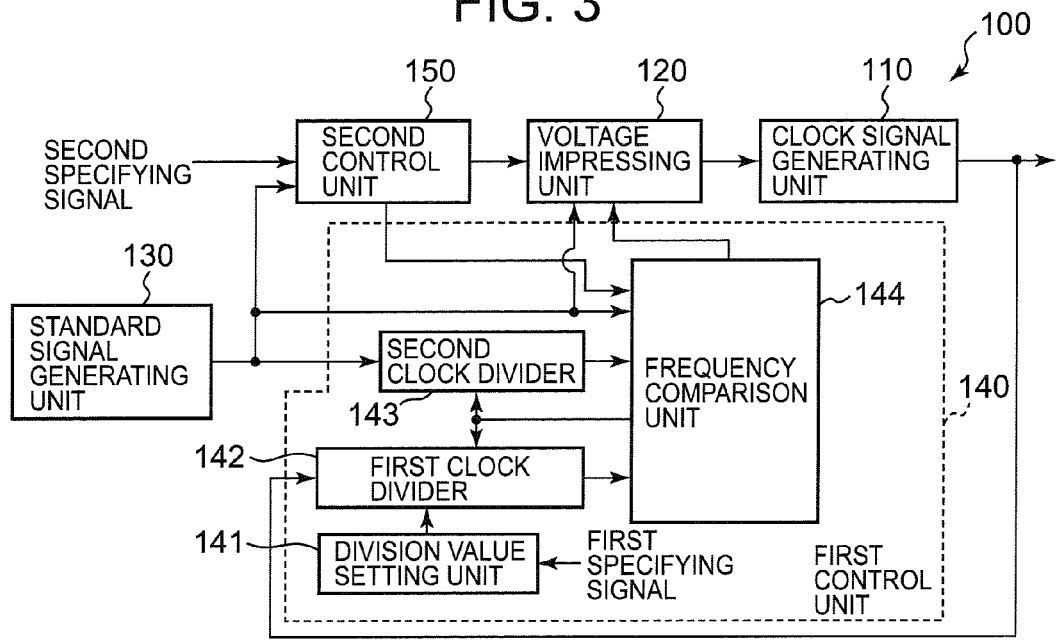
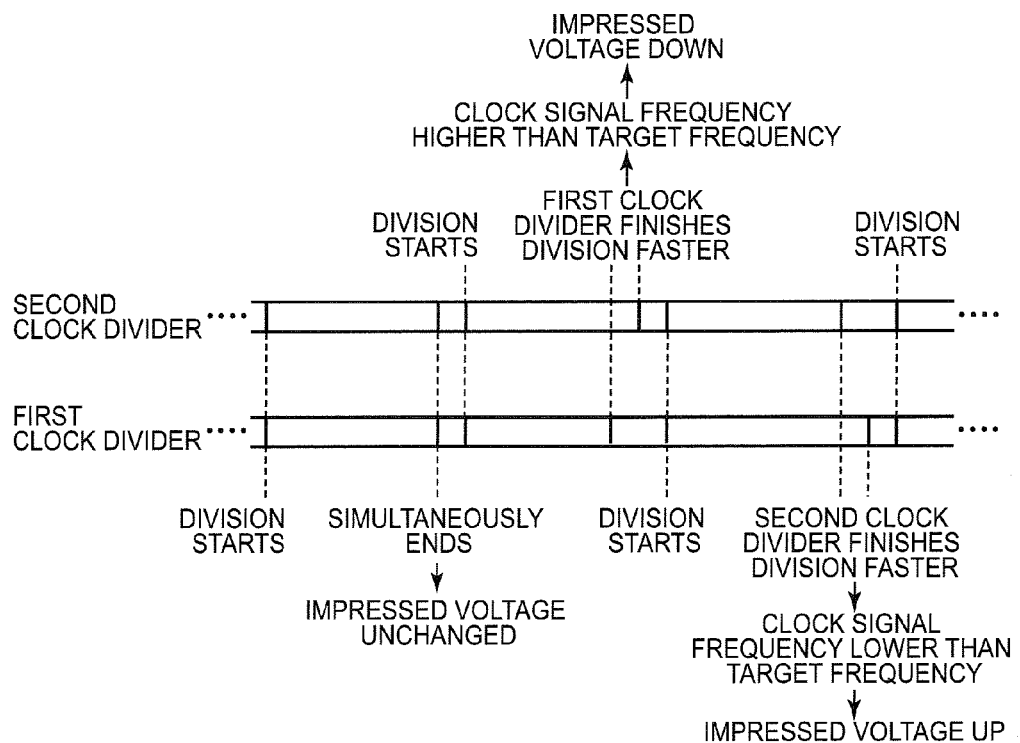

CLOCK SIGNAL GENERATING DEVICE AND ELECTRONIC DEVICE

CROSS-REFERENCE TO RELATED APPLICATION

This application claims the benefit of Japanese Patent Application 2009-275571, filed Dec. 3, 2009, and Japanese Patent Application 2010-075712, filed Mar. 29, 2010, the entire disclosures of which are incorporated by reference herein.

FIELD

This application relates generally to a clock signal generating device and an electronic device.

BACKGROUND

At present, a growing chorus of voices is clamoring for energy conservation in facilities and equipment in order to reduce costs and slow global warming. As technology to realize energy conservation, technology has been known that operates facilities and equipment by appropriately switching among a plurality of energy-saving modes. Among these energy-saving modes are, for example, a normal-frequency mode with relatively large energy consumption that operates under a normal clock frequency, and a low-frequency mode with smaller energy consumption than the normal-frequency mode that operates at a lower frequency than the normal clock frequency.

As this type of technology, Patent Literature 1 (Unexamined Japanese Patent Application KOKAI Publication No. 2004-242217) for example discloses a power consumption control device provided with a clock switch control circuit that measures a prescribed passage of time with a signal input from outside or a preset timing as the starting point and switches to a different power-saving mode at a prescribed time after the point in time when the prescribed passage of time has elapsed, and a PLL that switches the operating frequency in accordance with the switched energy-saving mode, in a power consumption control device that controls power consumption in accordance with any of a plurality of power consumption modes.

In addition, Patent Literature 2 (Unexamined Japanese Patent Application KOKAI Publication No. 2000-278104) and Patent Literature 3 (Unexamined Japanese Patent Application KOKAI Publication No. H08-23274) disclose technology for appropriately counting the pulse number of a standard frequency and the pulse number of a clock signal generated by a VCO (Voltage Controlled Oscillator) in order to detect with a PLL (Phase Locked Loop) that the frequency of the clock signal generated by the VCO matches or is higher or lower than a target frequency.

However, in the power consumption control device disclosed in Patent Literature 1, there are cases in which the operating frequency changes swiftly when switching operating frequencies because a format is adopted in which the frequency (operating frequency) of the clock signal generated by the PLL switches all at once to the target frequency. When the operating frequency changes rapidly in this manner, there are cases in which operation of the supply destination of the clock signal (the CPU (Central Processing Unit) and the like) becomes unstable (for example, software monitoring the operation of the PLL or the like becomes unstable, so the CPU and the like become unstable). On the other hand, it is desirable to change operating frequencies in a short time in order to respond to demand for faster processing when changing operating frequencies. This kind of problem arises in the above-described technology even in cases when a device other than a PLL is adopted.

In addition, with the technology disclosed in Patent Literature 2 and Patent Literature 3, when the target frequency is changed, for example the voltage impressed on the VCO must be controlled each 1,000 counts and time is needed for the frequency of the clock signal generated by the VCO to match the target frequency (appropriately including approximate matches that take errors and the like into consideration; the same also being true with the present invention). For example, if the voltage impressed on the VCO is changed in 1,000 steps, if the frequency of the clock signal does not match the target frequency, there are cases where dozens of seconds are needed in order for the frequency of the clock signal to match the target frequency. This kind of problem arises in the above-described technology even when other than PLL and VCO are adopted.

SUMMARY

In consideration of the foregoing, it is a first object of the present invention to provide a clock signal generating device and an electronic device that prevent or reduce unstable operation of supply destinations of clock signals when changing the frequency of the clock signals along with changing the specified frequency of the clock signals in a short time.

In addition, it is a second object of the present invention to provide a clock signal generating device and an electronic device in which the frequency of the generated clock signal is made to match the target clock signal in a short time even when the target frequency is changed.

In order to resolve the above problems, the clock signal generating device according to a first aspect of the present invention is a clock signal generating device in which a target frequency is set, comprising:

a clock signal generating unit that, in addition to having voltages successively impressed, successively generates clock signals having frequencies corresponding to the successively impressed voltages;

a first control unit that compares the target frequency and the frequency of the clock signal generated by the clock signal generating unit and on the basis of the comparison results controls the voltage impressed on the clock signal generating unit so the frequency of the clock signal newly generated by the clock signal generating unit becomes the target frequency; and a second control unit that, when the target frequency changes, successively changes the voltage impressed on the clock signal generating unit by a preset change value and a preset interval within a preset time in place of the first control unit to cause the frequency of the clock signal newly generated by the clock signal generating unit to approach the target frequency.

In addition, the electronic device according to a second aspect of the present invention comprises:

the clock signal generating device; and a processing device that uses the first clock signal generated by the clock signal generating unit in the clock signal generating device.

In addition, the clock signal generating device according to a third aspect of the present invention comprises:

a PLL (Phase Locked Loop) provided with a VCO (Voltage Controlled Oscillator) on which voltages are successively impressed and which successively outputs clock signals whose frequencies correspond to the successively impressed voltages; and a control unit to which a specifying signal specifying the target frequency of the clock signal is supplied and in which when the target frequency is changed by the supplied specifying signal, the control unit successively changes the voltage impressed on the VCO by a predetermined change value and a predetermined interval in a predetermined time in place of the PLL and to cause the frequency of the clock signal newly generated by the VCO to approach the target frequency.

In order to resolve the above-described problems, the clock signal generating device according to a fourth aspect of the present invention comprises:

a clock signal generating unit that generates a first clock signal having a frequency corresponding to the voltage value of an impressed voltage;

a first counter that counts pulses of the first clock signal generated by the clock signal generating unit up to a first setting number that has been set;

a second counter that counts pulse of a second clock signal that is a standard up to a second setting number that has been set;

a first control unit that, when a target frequency is set, sets the first setting number and the second setting number in the first counter and the second counter, respectively, in accordance with the target frequency that has been set; and a second control unit that successively accomplishes a voltage control process by causing counting by the first counter and the second counter to start, comparing the timing with which counting up to the first setting number ends in the first counter and the timing with which counting up to the second setting number ends in the second counter, and controlling the voltage value of the voltage impressed on the clock signal generating unit in accordance with the comparison results;

wherein the first setting number and the second setting number are numbers such that when the frequency of the first clock signal is the target frequency, the first counter and the second counter simultaneously finish counting after simultaneously starting to count; and the first control unit:

sets a first number in the first counter as the first setting number and sets a second number in the second counter as the second setting number when the target frequency set is a first target frequency;

sets a third number in the first counter as the first setting number and sets a fourth number in the second counter as the second setting number when the target frequency set is a second target frequency; and when the set target frequency is changed from the first target frequency to the second target frequency, at a first predetermined timing, sets a fifth number smaller than the third number in the first counter as the first setting number and sets a sixth number smaller than the fourth number in the second counter as the second setting number, and at a second predetermined timing after the first predetermined timing, sets the third number in the first counter and sets the fourth number in the second counter.

In addition, the electronic device according to a fifth aspect of the present invention comprises:

the clock signal generating device; and a processing device that uses the clock signal generated by the clock signal generating unit in the clock signal generating device.

BRIEF DESCRIPTION OF THE DRAWINGS

A more complete understanding of this application can be obtained when the following detailed description is considered in conjunction with the following drawings, in which:

FIG. 3 is a drawing for explaining the composition of a clock signal generating device according to the first embodiment of the present invention;

FIG. 4 is a schematic drawing explaining the process accomplished by a first control unit of the clock signal generating device according to the first embodiment of the present invention;

DETAILED DESCRIPTION

The preferred embodiments of the present invention are described below with reference to the drawings. The present invention is not limited by the embodiments and drawings below, for the embodiments and drawings below may naturally be altered (including omitting constituent elements). In addition, in the description below, explanation of commonly known technology items that are not critical is appropriately omitted in order to facilitate understanding of the present invention.

(First Embodiment)

First, a printer 900 to which a clock signal generating device 100 according to a first embodiment of the present invention is applied is explained with reference to FIGS. 1 and 2.

Figure 1:
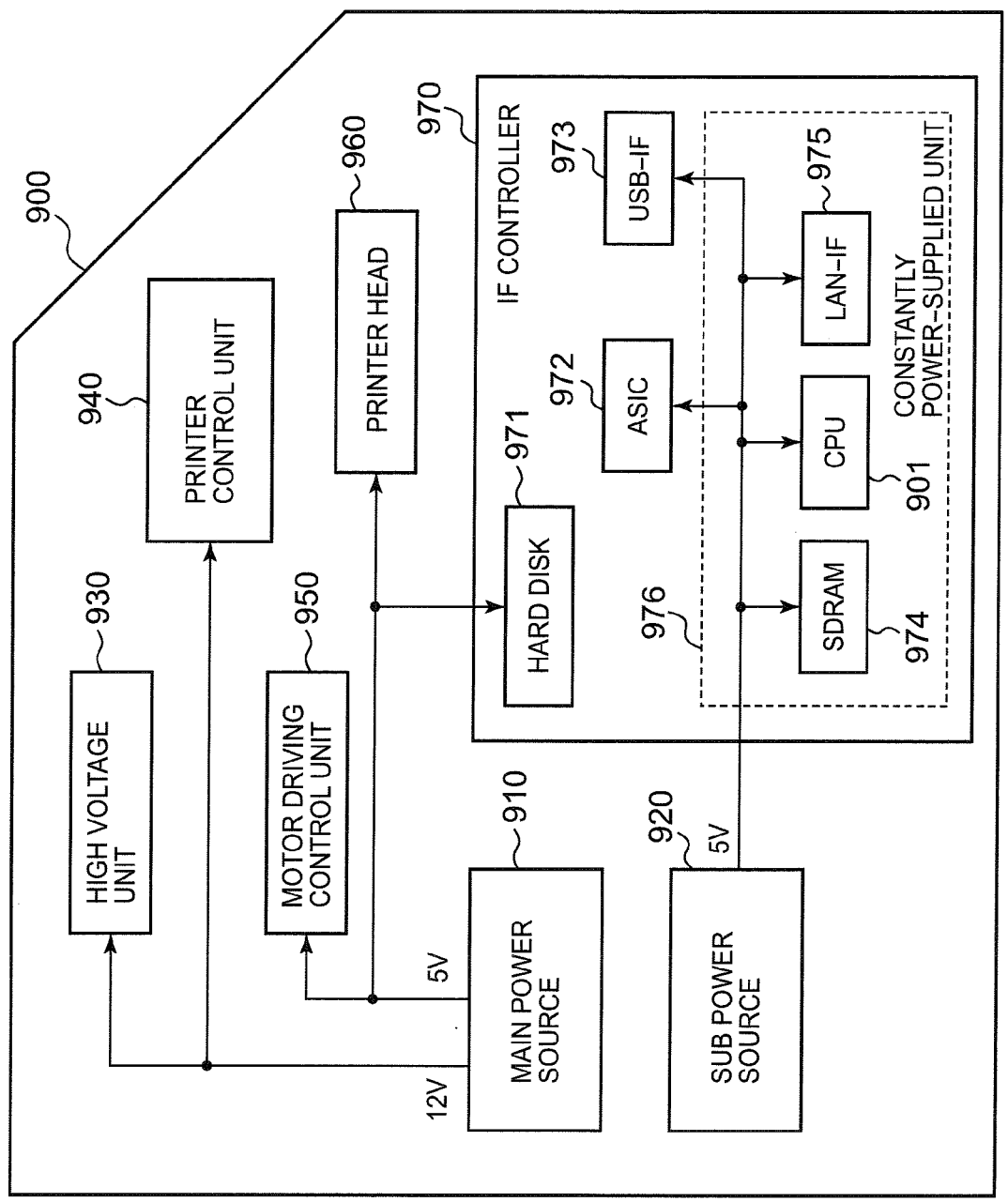
FIG. 1 is a drawing explaining the operation modes of a printer to which a clock signal generating device according to a first and second embodiment of the present invention is applied.

As shown in FIG. 1, the printer 900 has a main power source 910, a sub power source 920, a high voltage unit 930, a printer control unit 940, a motor drive control unit 950, a printer head 960 and an IF (interface) controller 970.

The main power source 910 is a power source that supplies power to the prescribed structures of the printer 900 at 5 V or 12 V in accordance with the operation mode of the printer 900.

The sub power source 920 is a power source that supplies power to the prescribed structures of the printer 900 at 5 V in accordance with the operation mode of the printer 900.

The high voltage unit 930 has a booster circuit and outputs high voltage in order to charge an unrepresented photosensitive drum and an unrepresented toner and the like.

The printer control unit 940 controls operation of a print engine 905 and the unrepresented photosensitive drum.

The motor drive control unit 950 drives and controls an unrepresented motor.

The printer head 960 exposes the photosensitive drum to a lay based on image data. The printer head 960 is composed, for example, of an LED printer head.

The IF controller 970 controls communication between the printer 900 and outside equipment. The IF controller 970 has a hard disk 971, an ASIC (Application Specific Integrated circuit) 972, a USB-IF (Universal Serial Bus-Interface) 973, SDRAM (Synchronous Dynamic Random Access Memory) 974, a LAN-IF (Local Area Network-Interface) 975, and a CPU (Central Processing Unit) 901.

The hard disk 971 stores programs and data used in printing.

The ASIC 972 is a circuit for controlling operation of the IF controller 970. The ASIC 972 works with the CPU 901 to control the IF controller 970 and the like.

The USB-IF 973 is an interface for communicating under USB standards with USB equipment (for example, a PC (Personal Computer) 400) outside the printer 900.

The SDRAM 974 is memory temporarily used by the CPU 901 and the like.

The CPU 901 works with the other constituent elements of the IF controller 970 to control the overall operation of the IF controller 970.

The LAN-IF 975 is an interface for communicating with equipment (for example, the PC (Personal Computer) 400) outside the printer 900 through a LAN 907.

The role of the clock signal generating device 100 in the printer 900 will now be simply explained.

Power consumption by the printer 900 differs depending on operation mode. Operation modes are broadly classified as non-sleep mode and sleep mode. The trigger for switching between a non-sleep mode and a sleep mode can be arbitrarily set. For example, the operation mode may transition from a non-sleep mode to a sleep mode when a prescribed time (for example, 60 seconds) has elapsed from the last time input of data to the USB-IF 973, input of data to the LAN-IF 975, or user operation of the below-described switch 9032 was detected. On the other hand, the operation mode can transition from a sleep mode to a non-sleep mode with the trigger being the detection of data input to the USB-IF 973, data input to the LAN-IF 975 or user operation of the below-described switch 9032.

As sleep modes, a normal sleep mode and a deep sleep mode may be prepared. Conditions for transitioning from normal sleep mode to deep sleep mode can be appropriately adjusted. For example, the operation mode may transition from normal sleep mode to deep sleep mode when a prescribed time (for example, five minutes) has elapsed since the time the operation mode transitioned to normal sleep mode during which no data input to the USB-IF 973, data input to the LAN-IF 975 or user operation of the below-described switch 9032 has been detected.

Power consumption in each mode (power consumption in standby status) is determined by which constituent elements power is supplied to or on a clock signal of what frequency the CPU 901 is operating.

In the present embodiment, in non-sleep modes power is supplied to the high voltage unit 930, the printer control unit 940, the motor drive control unit 950, the printer head 960 and the IF controller 970 (all constituent elements of the IF controller 970). Power at a voltage of 12 V is supplied from the main power source 910 to the high voltage unit 930 and the printer control unit 940. Furthermore, power at a voltage of 5 V is supplied from the main power source 910 to the motor drive control unit 950, the printer head 960 and the hard disk 971. On the other hand, power at a voltage of 5 V is supplied from the sub power source 920 to the ASIC 972, the USB-IF 973, the SDRAM 974, the LAN-IF 975 and the CPU 901.

On the other hand, in normal sleep mode, power is not supplied to any constituent elements other than the IF controller 970 (however, excluding the hard disk 971). Specifically, in normal sleep mode, power is supplied to the ASIC 972, the USB-IF 973, the SDRAM 974, the LAN-IF 975 and the CPU 901 and power is not supplied to the high voltage unit 930, the printer control unit 940, the motor drive control unit 950, the printer head 960 or the hard disk 971.

Furthermore, in deep sleep mode, power is supplied to the SDRAM 974, the LAN-IF 975 and the CPU 901 and power is not supplied to the other constituent elements. Because power is always supplied to the SDRAM 974, the LAN-IF 975 and the CPU 901 regardless of operation mode, the SDRAM 974, the LAN-IF 975 and the CPU 901 constitute a constant power-supplied unit 975.

In addition, in deep sleep mode, the frequency of the clock signal supplied to the CPU 901 is a lower frequency than the frequency of the clock signal supplied to the CPU 901 in normal sleep mode. Through this, power consumption in deep sleep mode is further reduced. Power consumption is largest in non-sleep mode, next largest in normal sleep mode and smallest in deep sleep mode.

The clock signal generating device 100 according to the present embodiment is a device that appropriately switches the frequency of the clock signal supplied to the CPU 901 when the operation mode is switched.

Next, the composition of the printer 900 is explained with reference to FIG. 2.

Figure 2:
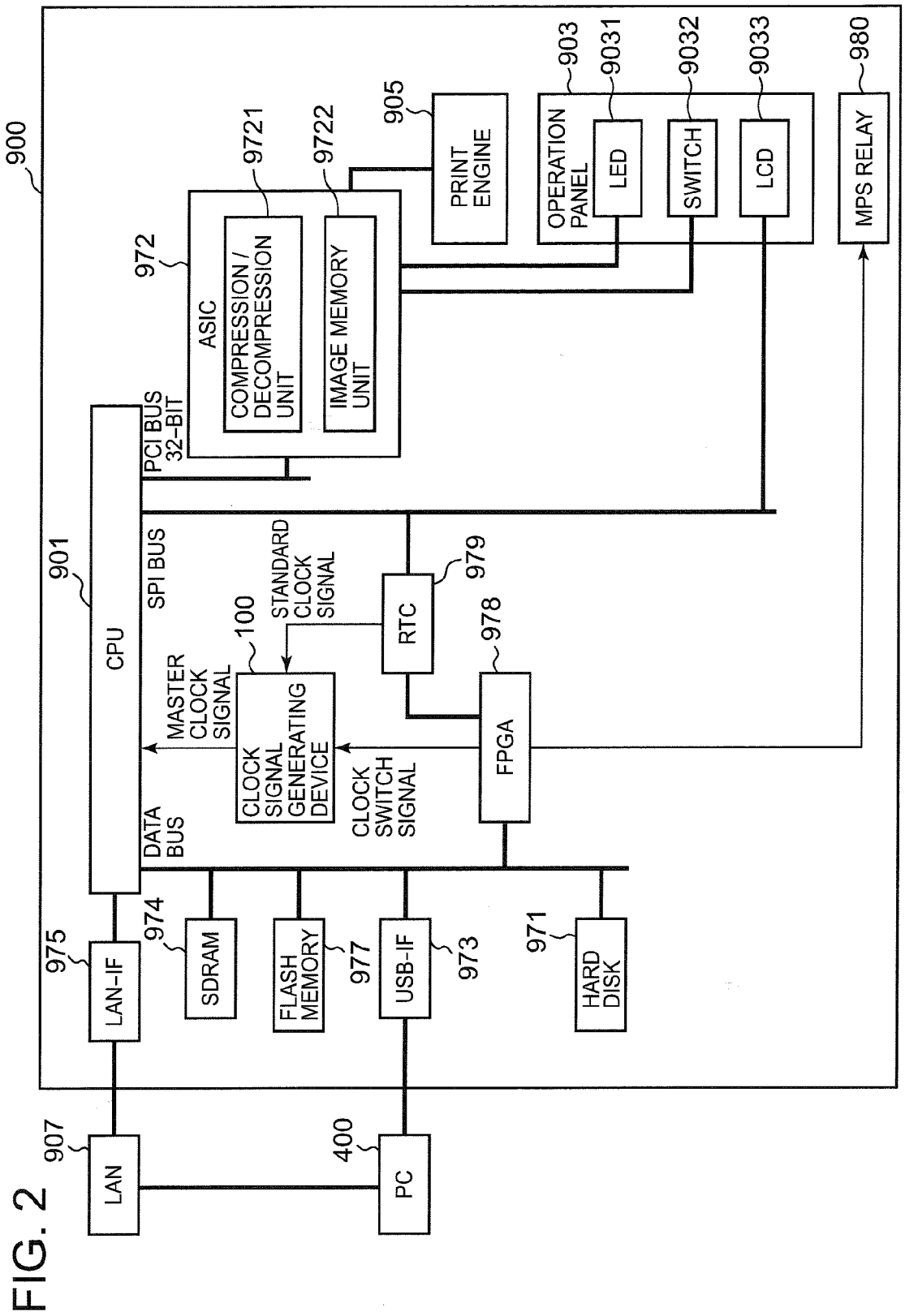
FIG. 2 shows the composition of a printer to which a clock signal generating device according to first and second embodiments of the present invention is applied.

As shown in FIG. 2, the printer 900 has a clock signal generating device 100, the CPU 901, an operation panel 903, a print engine 905, the hard disk 971, the ASIC 972, the USB-IF 973, the SDRAM 974, the LAN-IF 975, flash memory 977, an FPGA (Field Programmable Gate Array) 978, an RTC (Real Time Clock) 979 and a MPS (Main Power Switch) relay 980. Explanation of the constituent elements explained in FIG. 1 is omitted here.

The clock signal generating device 100 generates a master clock signal on the basis of a standard clock signal supplied from the RTC 979. The clock signal generating device 100 supplies the generated master clock signal to the CPU 901. The clock signal generating device 100 switches the frequency of the generated master clock signal in accordance with a clock switch signal supplied from the FPGA 978.

The operation panel 903 displays an image to a user of the printer 900 and receives operation input from the user. The operation panel 903 has an LED (Light Emitting Diode) 9031, a switch 9032 and an LCD (Liquid Crystal Display) 9033. The LED 9031 exhibits the printing status to the user by flashing in prescribed colors. The switch 9032 is composed of a momentary switch or the like and receives press operations from the user. The LCD 9033 exhibits to the user images showing printing conditions and printing status. The LCD 9033 is connected to the CPU 901 by an SPI (Serial Peripheral Interface) Bus, for example.

The print engine 905 prints on paper images displayed by image data supplied from the ASIC 972.

The ASIC 972 has a compression/decompression unit 9721 and an image memory unit 9722. The compression/decompression unit 9721 compresses and decompresses image data supplied from the CPU 901 and image data stored in the image memory unit 9722. The image memory unit 9722 stores image data supplied from the CPU 901 and image data that has been processed by the compression/decompression unit 9721. The ASIC 972 is connected to the CPU 901 by a 32-bit PCI bus, for example.

The flash memory 977 stores programs and data used in the printing process.

The FPGA 978 is an LSI (Large Scale Integration) that a designer can program, and constitutes a necessary circuit in the printing process. The FPGA 978 supplies clock switch signals to the clock signal generating device 100.

The hard disk 971, the USB-IF 973, the SDRAM 974, the flash memory 977 and the FPGA 978 are connected to the CPU 901 by a data bus, for example.

The RTC 979 is a device with a built-in crystal oscillator or the like for measuring time. The RTC 979 supplies a standard clock signal to the clock signal generating device 100. The frequency of the standard clock signal is, for example, 32.768 kHz. The clock signal generating device 100 according to the present embodiment reduces power consumption by the CPU 901 operating under a clock signal generated on the basis of a standard clock signal of low frequency supplied from the RTC 979 provided in advance in the printer 900.

The MPS relay is a relay for turning the main power source of the printer 900 on and off.

Next, the composition of the clock signal generating device 100 according to the present embodiment is explained with reference to FIG. 3.

In the clock signal generating device 100, one target frequency out of a plurality of predetermined target frequencies is set, and the clock signal generating device 100 operates so as to generate and output a clock signal of the set target frequency.

Setting of the target frequency is accomplished, for example, by a specifying signal (the below-described first signal or second signal) specifying one target frequency out of the plurality of predetermined target frequencies being supplied to the clock signal generating device 100. The clock signal generating device 100 operates so as to generate and output a clock signal of the target frequency (the target frequency set in the clock signal generating device 100) specified by the specifying signal supplied to the clock signal generating device 100.

The clock signal is supplied to supply destinations such as a processing device that accomplishes a prescribed processes, such as the CPU (Central Processing Unit), for example. The target frequency is a frequency requested as the frequency of the clock signal generated by the clock signal generating device 100, and is the frequency the supply destination needs.

The supply destination uses the clock signal supplied without change, or multiplies the frequency of this clock signal by an integer and uses the signal after integer multiplication. In this manner, the supply destination uses the clock signal as an operating clock signal.

The clock signal generating device 100 has a clock signal generating unit 110, a voltage impressing unit 120, a standard signal generating unit 130, a first control unit 140 and a second control unit 150. These constituent elements are composed of prescribed electronic circuits.

A prescribed voltage is impressed on the clock signal generating unit 110 by the voltage impressing unit 120. The clock signal generating unit 110 generates a clock signal (clock pulse) of a frequency corresponding to the impressed voltage. The clock signal generating unit 110 outputs the generated clock signal. The clock signal generating unit makes the frequency of the generated clock signal larger as the impressed voltage becomes larger (although this need not be a proportional relationship). Below, the voltage impressed on the clock signal generating unit 110 is appropriately called the impressed voltage.

One control value out of a plurality of control values that can be set is set in the voltage impressing unit 120. The plurality of control values that can be set are, for example, 0 to 255 (0 to FF in hexadecimal). The voltage impressing unit 120 impresses a voltage on the clock signal generating unit 110 in accordance with the set control value. The voltage impressing unit 120 increases the impressed voltage as the set control value becomes larger (although this need not be a proportional relationship). If the control value becomes large, the frequency of the newly generated clock signal also becomes large.

The voltage impressing unit 120 preserves the set control value and increases and decreases one at a time the preserved control values in accordance with instructions from the first control unit 140 or the second control unit 150. By increasing or decreasing this, the impressed voltage increases or decreases. The voltage impressing unit 120 includes a D/A (digital-to-analog) converter that generates a voltage (analog) in accordance with the set control value (digital), for example.

The standard signal generating unit 130 generates a standard signal (clock pulse) that is a standard clock signal having a standard frequency. The standard signal generating unit 130 outputs the generated standard signal. The standard signal generating unit 130 is, for example, composed by a standard clock generator that includes a crystal oscillator and an oscillation circuit. The frequency of the standard signal is taken to be 32.768 kHz in this explanation, but the standard signal may be a signal with another frequency.

The standard signal generating unit 130 supplies the generated standard signal to a second clock divider 143, a frequency comparison unit 144, a second control unit 150 and a voltage impressing unit 120. The frequency comparison unit 144, the second control unit 150 and the voltage impressing unit 120 operate with timing (for example, the timing of one pulse or multiple pulses) based on the standard signal. The frequency comparison unit 144, the second control unit 150 and the voltage impressing unit 120 are synchronized through the standard signal. The timing of each one pulse is, for example, the timing of the rising edge of each pulse rise, and the timing of each multiple pulses is, for example, the timing of the rising edge each multiple pulses.

The first control unit 140 has a division value setting unit 141, a first clock divider 142, a second clock divider 143 and a frequency comparison unit 144.

A first specifying signal is supplied to the division value setting unit 141. This first specifying signal is supplied from a processing device that is the supply destination of clock signals, for example. The first specifying signal is a signal specifying the target frequency. The division value setting unit 141 sets a division value corresponding to the supplied first specific value in the first clock divider 142.

By supplying the first specifying signal to the division value setting unit 141, the target frequency specified by this first specifying signal is set in the first control unit 140, and the first control unit 140 accomplishes processes in accordance with this set target frequency (the target frequency specified by the supplied first specifying signal).

The clock signal output from the clock signal generating unit 110 is supplied to the first clock divider 142. The first clock divider 142 divides the supplied clock signal by the division value set by the division value setting unit 141. Through this division, the pulse of the clock signal is counted. The divided clock signal post-division is supplied from the first divider 142 to the frequency comparison unit 144.

The first divider 142 divides the clock signal using a first division value among a predetermined plurality of division values, for example. The predetermined plurality of division values are a plurality of division values (the plurality of division values set by the division value setting unit 141) in accordance with target frequencies. The division value setting unit 141 designates the division value corresponding to the first specifying signal from among the predetermined plurality of division values. The first divider 142 divides the clock signal using this designated division value. Through this, the division value setting unit 141 sets the division value corresponding to the first specific value in the first clock divider 142, and the first clock divider 142 divides the clock signal with the division value that has been set.

The standard signal output by the standard signal generating unit 130 is supplied to the second clock divider 143. The second clock divider 143 divides the supplied standard signal by the preset division value. Through this division, the pulse of the standard signal is counted. The divided post-division clock signal is supplied from the second clock divider 143 to the frequency comparison unit 144.

In this embodiment, the target frequency is 10 MHz or 50 MHz. At this time, the first specifying signal is assumed to be a High signal when 50 MHz is specified as the target frequency and is assumed to be a Low signal when 10 MHz is specified as the target frequency.

In addition, in this embodiment the predetermined plurality of division values in the first clock divider 142 is taken to be 312,500 and 1,562,500. Here, 312,500 is the division value when the target frequency is 10 MHz, and 1,562,500 is the division value when the target frequency is 50 MHz.

For example, when a Low signal is supplied to the division value setting unit 141 as the first specifying signal, the division value setting unit 141 designates 312,500, which is the division value corresponding to the Low signal (a signal specifying 10 MHz), from among the predetermined plurality of division values (312,500 and 1,562,500). Through designating this, the division value of 312,500 is set in the first clock divider 142, and the first clock divider 142 accomplishes division by 312,500 on the clock signal.

In addition, in this embodiment the division value set in the second clock divider 143 is 1,000. The second clock divider 143 divides the standard signal by 1,000.

The target frequency is not limited to the aforementioned frequencies, and in addition, there may be three or more target frequencies. In this case, the first specifying signal is a signal that can specify each of these frequencies. In addition, the division value of the first clock divider 142 and the division value of the second clock divider 143 are not limited to the above. These division values are values such that when a clock signal having the target frequency and the standard clock signal are divided by the respective division values, the signals are divided into clock signals with the same period.

The frequency comparison unit 144 controls the first clock divider 142 and the second clock divider 143, causes division to start simultaneously and determines which completes division first (from which of these one period of clock signal that is a post-division clock signal is supplied). As noted above, the division value is a value corresponding to the target frequency, so through this determination, the frequency comparison unit 144 compares the frequency of the clock signal with the target frequency. Furthermore, the frequency comparison unit 144 controls the control value set in the voltage impressing unit 120 in accordance with the results of this comparison. Through this, the frequency comparison unit 144 controls the impressed voltage.

This control is described with reference to FIG. 4.

The division value is a value corresponding to the target frequency as described above, and for example when both complete division simultaneously, the frequency of the clock signal is the target frequency. At this time, it is not necessary to change the frequency of the clock signal, so the frequency comparison unit 144 does not change the control value set in the voltage impressing unit 120. Consequently, the impressed voltage does not change.

If the first clock divider 142 finishes division sooner, for example, the frequency of the clock signal is higher than the target frequency. In this case, the frequency comparison unit 144 controls the voltage impressing unit 120 and lowers the control value set in the voltage impressing unit 120 in order to lower the frequency of the clock signal. As described above, if the control value decreases, the impressed voltage decreases and the frequency of the clock signal newly generated by the clock signal generating unit 110 decreases.

If the second clock divider 143 finishes division sooner, for example, the frequency of the clock signal is lower than the target frequency. In this case, the frequency comparison unit 144 controls the voltage impressing unit 120 and raises the control value set in the voltage impressing unit 120 in order to raise the frequency of the clock signal. As described above, if the control value increases, the impressed voltage increases and the frequency of the clock signal newly generated by the clock signal generating unit 110 increases The first control unit 140 repeatedly accomplishes the above-described comparison of frequencies and control of impressed voltage. Through this, the frequency of clock signals successively generated by the clock signal generating unit 110 gradually approaches the target frequency and is adjusted to become the target frequency. Because the first control unit 140 controls the impressed voltage from comparisons between the frequency of the clock signal and the target frequency, the frequency of clock signals successively generated by the clock signal generating unit 110 is not greatly above or below the target frequency. Consequently, through controlling the impressed voltage by the first control unit 140, the frequency of the clock signal is not greatly blurred.

The first control unit 140, the clock signal generating unit 110 and the voltage impressing unit 120 may be comprised of at least a portion of a PLL (Phase Locked Loop), which is an electronic circuit that operates so that the target frequency and the frequency of the clock signal match. The clock signal generating unit 110 may be composed of a VCO (Voltage Controlled Oscillator), for example. Through this, the clock signal generating device 110 can be easily composed using existing PLL and the like.

A second specifying signal is supplied to the second control unit 150. This second specifying signal is supplied from the same place as the first specifying signal. The second specifying signal is a signal that specifies the target frequency of the clock signal. The first specifying signal and the second specifying signal are the same signal here, but both need only be signals that specify the target frequency of the clock signal with the same timing.

Figure 5:
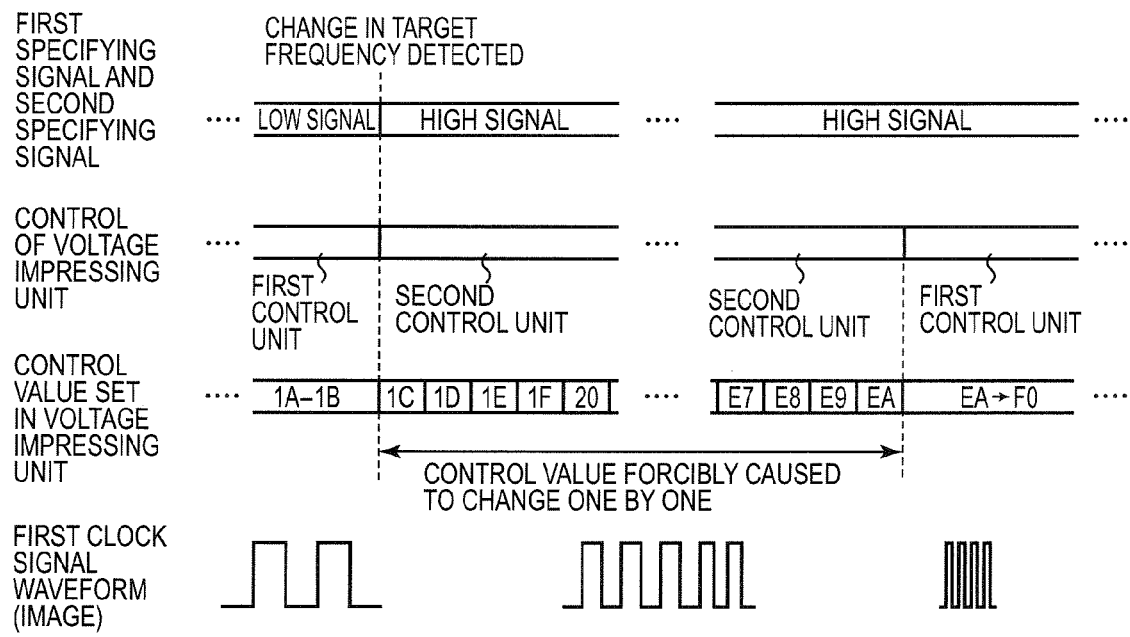
FIG. 5 is a schematic drawing explaining the process (a process corresponding to an increasing change in the target frequency) accomplished by a second control unit of the clock signal generating device according to the first embodiment of the present invention.
Figure 6:
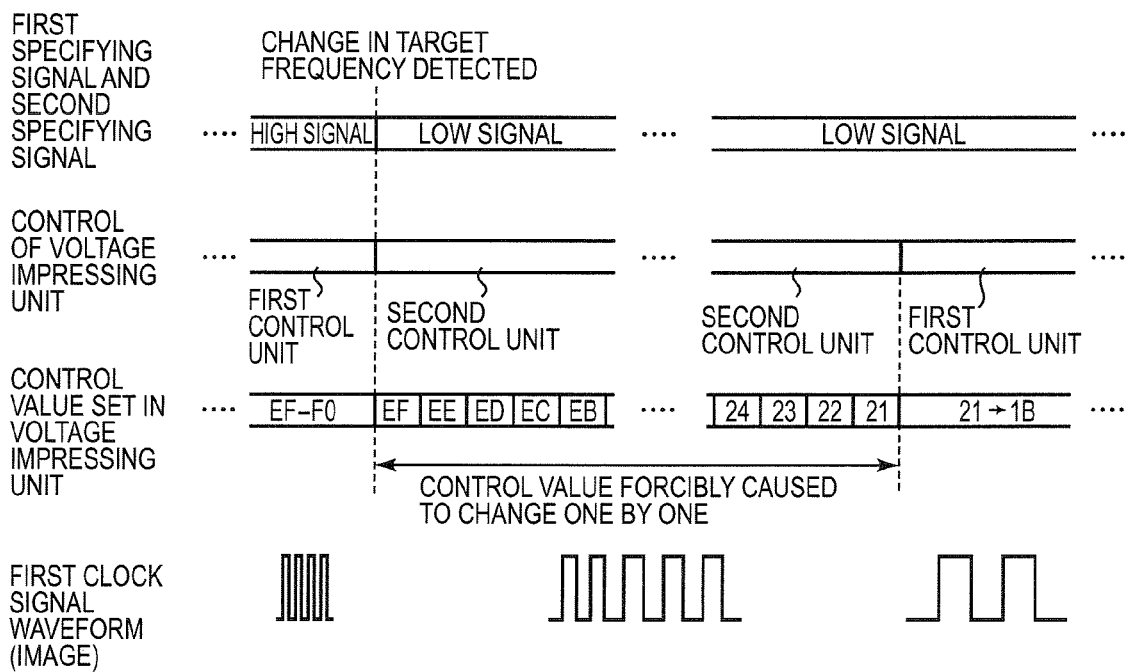
FIG. 6 is a schematic drawing explaining the process (a process corresponding to a decreasing change in the target frequency) accomplished by a second control unit of the clock signal generating device according to the first embodiment of the present invention.

Operation of the second control unit 150 will now be explained (with reference to FIGS. 5 and 6).

The second control unit 150 detects changes (increasing changes or decreasing changes) in the target frequency specified by the second specifying signal on the basis of the second specifying signal. As described below, the second control unit 150 accomplishes processes in accordance with this change. In other words, by the second specifying signal being supplied to the second control unit 150, the target frequency is set in the second control unit 150 and the second control unit 150 accomplishes processes in accordance with changes in the target frequency (the target frequency specified by the second specifying signal supplied to the second control unit 150) set in the second control unit 150.

The second control unit 150 detects changes in the target frequency through changes in the second specifying signal or the like. For example, when the second specifying signal switches from a Low signal to a High signal, the target frequency changes from 10 MHz to 50 MHz, so the second control unit 150 detects an increasing change in the target frequency. For example, when the second specifying signal switches from a High signal to a Low signal, the target frequency changes from 50 MHz to 10 MHz, so the second control unit 150 detects a decreasing change in the target frequency.

When the second control unit 150 detects a change in the target frequency, the frequency comparison unit 144 and the voltage impressing unit 120 are controlled and control of the voltage impressing unit 120 is started in place of the first control unit 140. For example, the second control unit 150 controls the frequency comparison unit 144 and the voltage impressing unit 120, the frequency comparison unit 144 is placed on standby and the voltage impressing unit 120 is caused to receive control from the second control unit 150.

When the clock signal generating device 100 begins to operate (for example, when the power is turned on), the first control unit 140 operates and controls the voltage impressing unit 120. In addition, when the clock signal generating device 100 begins to operates, the first specifying signal and the second specifying signal are supplied to the first control unit 140 and the second control unit 150, respectively.

When the second control unit 150 begins to control the voltage impressing unit 120 in place of the first control unit 140, the first control unit 140 may operate or at least a portion may go to standby (standby for comparison operations) or at least a portion may not operate (comparison operation). When the second control unit 150 controls the voltage impressing unit 120, power consumption by the clock signal generating device 100 is reduced by having at least a portion of the first control unit 140 go to standby or not operate.

When the second control unit 150 detects an increasing change, in the first period the voltage impressing unit 120 (control value) is controlled and in the first time interval, the control value is increased one by one. Through this, the second control unit 150 successively increases the impressed voltage by the first change value, and the frequency of the clock signal generated by the clock signal generating unit 110 successively increases. Through this, the frequency of the clock signal successively generated by the clock signal generating unit 110 successively approaches the target frequency that has been changed upward (here, 50 MHz).

When the second control unit 150 detects a decreasing change, in the second period the voltage impressing unit 120 (control value) is controlled and in the second time interval, the control value is decreased one by one. Through this, the second control unit 150 successively decreases the impressed voltage by the second change value, and the frequency of the clock signal generated by the clock signal generating unit 110 successively decreases. Through this, the frequency of the clock signal successively generated by the clock signal generating unit 110 successively approaches the target frequency that has been changed downward (here, 10 MHz).

When the end of the first period or the second period has arrived, the second control unit 150 controls the frequency comparison unit 144 and the voltage impressing unit 120 and causes the first control unit 140 to resume control of the voltage impressing unit 120. For example, the second control unit 150 causes the frequency comparison unit 144 to resume operations and causes the voltage impressing unit 120 to be controlled by the first control unit 140. When control of the voltage impressing unit 120 by the first control unit 140 is resumed, the second control unit 150 breaks control of the voltage impressing unit 120. Through this, after the second control unit 150 has controlled the voltage impressing unit 120 for the first period or the second period, the first control unit 140 controls the voltage impressing unit 120 in place of the second control unit 150.

As described above, when the target frequency is changed, the second control unit 150 forcibly changes the impressed voltage to a certain degree, and after the successively generated clock signal has approached the target frequency to a certain degree, the first control unit 140 again accomplishes control of the voltage impressing unit 120, and through this the frequency of the clock signal approaches the target frequency without greatly blurring.

As described above, the standard signal is supplied to the second control unit 150 from the standard signal generating unit 130. The second control unit 150 causes the control value to change (increase or decrease one at a time) each one or multiple pulses of the standard signal, for example, as discussed above. The aforementioned first time interval and second time interval are the interval of this one or multiple pulses. This first time interval and second time interval are preset.

In addition, the first period and the second period are preset. The first period and the second period may be the period from when it is detected that the target frequency has been changed, finishing prior to the frequency of the clock signal reaching the target frequency when the control value is decreased or increased one by one (this can be calculated experimentally). Through this, it is possible to prevent the control value from changing too much and to prevent the frequency of the clock signal from going above or below the target frequency. In addition, this period can be stipulated by the number of times the control value is changed one by one. In other words, the second control unit 150 causes the control value to change during the aforementioned predetermined period by causing the control value to change a predetermined number of times.

Here, the explanation was of the case where the first period and the second period are the same period, but it would be fine for these two to be differing periods. In addition, the explanation was for the first time interval and the second time interval being the same time interval, but it would be fine for these two to be differing periods.

Control and the like of the voltage impressing unit 120 accomplished when the second control unit 150 has detected an increasing change will be explained in detailed with reference to FIG. 5.

Prior to the first specifying signal switching from the Low signal to the High signal, the frequency of the clock signal becomes the same or roughly the same (when including errors; the same for "roughly" below) as the 10 MHz (target frequency) the Low signal specifies, and at this time, the control value set in the voltage impressing unit 120 changes between 1A and 1B. The reason the control value changes is because of errors or the like. In addition, this control value is controlled by the first control unit 140. Let the control value immediately prior to the first specifying signal switching from Low signal to High signal be 1B. In addition, let the first period be the period during which the control value is caused to change 207 times.

Furthermore, let the control value when the first specifying signal becomes a High signal and the frequency of the clock signal becomes 50 MHz (target frequency) (or roughly 50 MHz) be F0. This control value in reality includes errors and the like, and for example in some cases may change between F0 and F1, but let us assume F0 here.

After an increasing change is detected, the second control unit 150 causes the control value to increase one by one 207 times in each first time period (each pulse of the standard signal). Through this, the control value increases from 1B to 1C, D . . . E9 and EA. Through such increases, the frequency of the clock signals generated successively by the clock signal generating unit 110 gradually increases and approaches the target frequency of 50 MHz.

When the end of the first period arrives (when the control value has changed 207 times), the voltage impressing unit 120 is again controlled by the first control unit 140 instead of the second control unit 150. Furthermore, through control by the first control unit 140, the control value changes one by one from EA to F0. Through this, the frequency of the clock signal becomes the target frequency of 50 MHz (or roughly 50 MHz). In this manner, by having the first control unit 140 resume control of the voltage impressing unit 120, the frequency of the clock signal successively generated by the clock signal generating unit 110 reaches the target frequency without greatly blurring.

Next, control of the voltage impressing unit 120 when the second control unit 150 has detected a decreasing change will be described in detail with reference to FIG. 6.

Prior to the first specifying signal switching from the High signal to the Low signal, the frequency of the clock signal becomes the same or roughly the same as the 50 MHz (target frequency) the High signal specifies, and at this time, the control value set in the voltage impressing unit 120 changes between EF and F0. The reason the control value changes is because of errors or the like. In addition, this control value is controlled by the first control unit 140. Let the control value immediately prior to the first specifying signal switching from High signal to Low signal be F0. In addition, let the second period be the period during which the control value is caused to change 207 times.

Furthermore, let the control value when the first specifying signal becomes a Low signal and the frequency of the clock signal becomes 10 MHz (target frequency) (or roughly 10 MHz) be 1B. This control value in reality includes errors and the like, and for example in some cases may change between 1B and 1A, but let us assume 1B here.

After a decreasing change is detected, the second control unit 150 causes the control value to decrease one by one 207 times in each second time period (each pulse of the standard signal). Through this, the control value decreases from F0 to F1, F2 . . . 22 and 21. Through such decreases, the frequency of the clock signal generated successively by the clock signal generating unit 110 gradually decreases and approaches the target frequency of 10 MHz.

When the end of the second period arrives (when the control value has changed 207 times), the voltage impressing unit 120 is again controlled by the first control unit 140 instead of the second control unit 150. Furthermore, through control by the first control unit 140, the control value changes one by one from 21 to 1B. Through this, the frequency of the clock signal becomes the target frequency of 10 MHz (or roughly 10 MHz). In this manner, by having the first control unit 140 resume control of the voltage impressing unit 120, the frequency of the clock signal successively generated by the clock signal generating unit 110 reaches the target frequency without greatly blurring.

Next, details of the operation of the clock signal generating device 100 will be described. The operation below appropriately ends when the power source is turned off.

Figure 7:
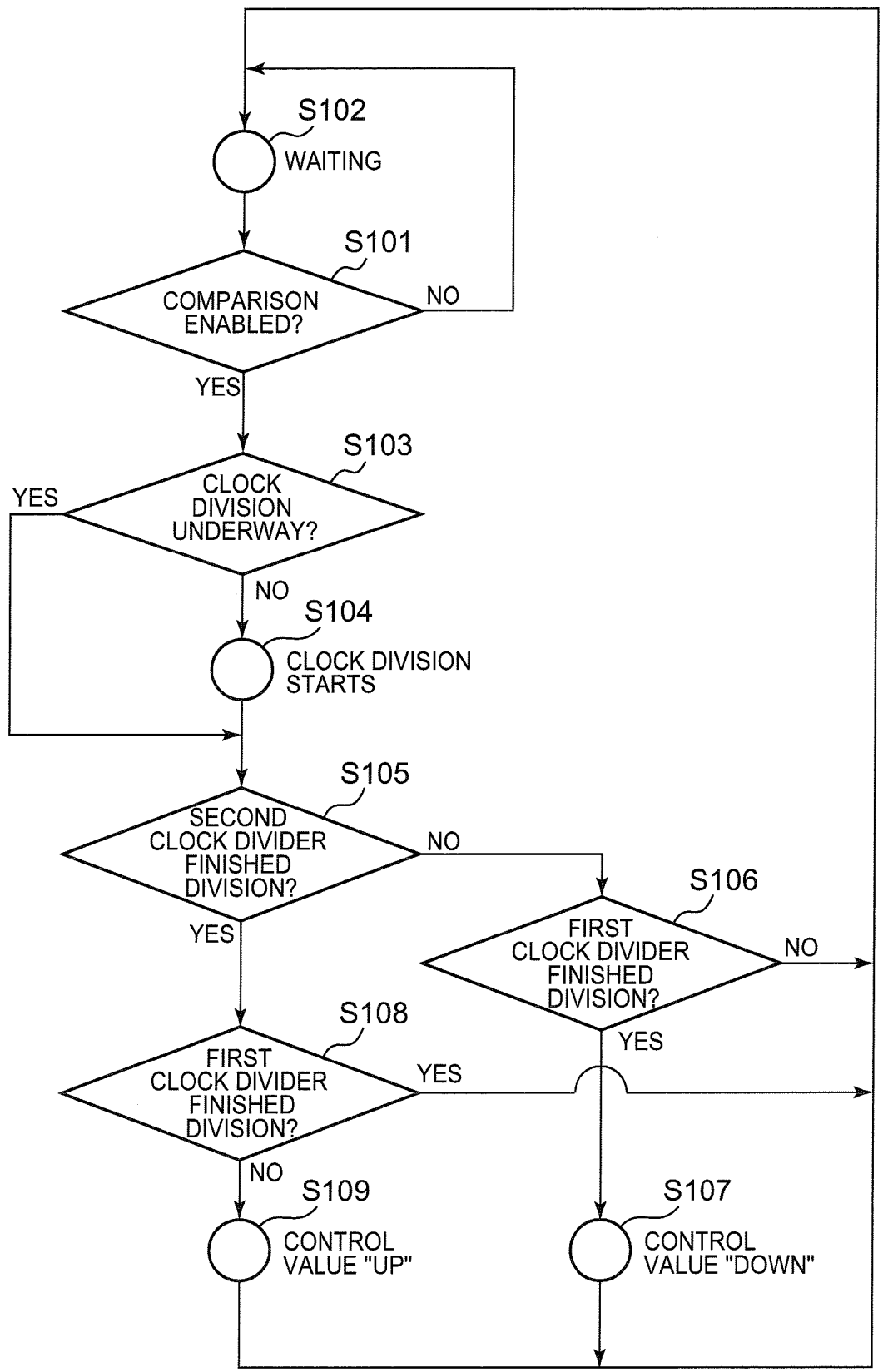
FIG. 7 shows the operation flow accomplished by the first control unit of the clock signal generating device according to the first embodiment of the present invention.

First, the operation of the frequency comparison unit 144 is explained with reference to FIG. 7. As described above, the standard signal is supplied to the frequency comparison unit 144 from the standard signal generating unit 130. In addition, the operations of the frequency comparison unit 144 begin from step S102, for example, when the clock signal generating device 100 begins to operate.

The frequency comparison unit 144 determines whether or not to enable comparisons (step S101). For example, if "1" is set in the frequency comparison unit 144 as the setting value (hereafter, the comparison setting value) relating to this comparison, the determination here would be YES (step S101; YES). For example, if "0" is set in the frequency comparison unit 144 as the comparison setting value, the determination here would be NO (step S101; NO).

When the second control unit 150 detects changing of the target frequency as described above, the second control unit 150 sets the comparison setting value to "0" in the frequency comparison unit 144 and the frequency comparison unit goes to standby. Through this, the second control unit 150 accomplishes control of the impressed voltage in place of the frequency comparison unit 144. In the frequency comparison unit 144, normally "1" is set as the comparison setting value and the first control unit 140 controls the voltage impressing unit 120.

When the frequency comparison unit 144 determines NO in the determination in the process of step S101 (step S101; NO), the unit waits until the next pulse of the standard signal is supplied to the frequency comparison unit 144 (step S102), and when the next pulse is supplied, again executes the process of step S101. Until the next pulse is supplied means, for example, until the rising edge of the next pulse (the same hereafter regarding supplying of pulses of the standard signal). By repeating the process of NO in step S101 and the process of step S102, the frequency comparison unit 144 waits as long as "0" is set as the comparison setting value (until "1" is set). When NO is determined in the process of step S101, the frequency comparison unit 144 controls the first clock divider 142 and the second clock divider 143, if at least one of these is in clock division, and halts the clock division.

When YES is determined by the determination in the process of step S101 (step S101; YES), the frequency comparison unit 144 determines whether or not the first clock divider 142 or the second clock divider 143 are in clock division (step S103). For example, after clock division has been started in the process of step S104, when the frequency comparison unit 144 determines NO in step S105 and step S106, (clock division has not been finished at this time), the determination is that the first clock divider 142 or the second clock divider 143 is in clock division (step S103; YES). The frequency comparison unit 144 controls the first clock divider 142 and the second clock divider 143 and also compares the ending of clock division, so this unit can determine whether or not the first clock divider 142 or the second clock divider 143 is in clock division.

When the determination is that the neither the first clock divider 142 nor the second clock divider 143 is in clock division (step S103; NO), the frequency comparison unit 144 controls the first clock divider 142 and the second clock divider 143 with the timing of the next standard signal pulse being supplied to the frequency comparison unit 144 from the standard signal generating unit 130, clock division is started simultaneously in both (step S104) and the process of step S105 is accomplished.

When the frequency comparison unit 144 determines that the first clock divider 142 or the second clock divider 143 is in clock division (step S103; YES), the process in step S105 is accomplished.

In the process in step S105, the frequency comparison unit 144 determines whether or not clock division by the second clock divider 143 has ended. This determination is accomplished, for example, through whether or not a clock signal (post-division signal) of one period has been supplied from the second clock divider 143 (for example, the rising edge of the next pulse). The frequency comparison unit 144 determines that clock division by the second clock divider 143 has ended (step S105; YES) when a clock signal of one period is supplied, for example, and determines that clock division by the second clock divider 143 has not ended (step S105; NO) when a clock signal of one period is not supplied.

When the frequency comparison unit 144 determines that clock division by the second clock divider 143 has not ended (step S105; NO), a determination is made as to whether or not clock division by the first clock divider 142 has ended (step S106). This determination is accomplished, for example, through whether or not a clock signal (post-division signal) of one period has been supplied from the first clock divider 142 (for example, the rising edge of the next pulse). The frequency comparison unit 144 determines that clock division by the first clock divider 142 has ended (step S106; YES) when a clock signal of one period is supplied, for example, and determines that clock division by the first clock divider 142 has not ended (step S106; NO) when a clock signal of one period is not supplied.

When it is determined that clock division by the first clock divider 142 has not ended (step S106; NO), the frequency comparison unit 144 returns to step S102. When it is determined that clock division by the first clock divider has not ended, this means that clock division by neither the first clock divider 142 nor the second clock divider 143 has ended after the start of clock division by the first clock divider 142 and the second clock divider 143 (step S104). Consequently, the frequency comparison unit 144 repeats the process of step S102, step S101, YES in step S103, NO in step S105 and NO in step S106 until at least one out of the first clock divider 142 and the second clock divider 143 finishes clock division after the start of clock division, or until the comparison setting value is changed.

On the other hand, when it is determined that clock division by the first clock divider 142 has ended (step S106; YES), the frequency comparison unit 144 outputs an instruction to lower the control value by 1 to the voltage impressing unit 120 with the timing of the next pulse of the standard signal supplied to the frequency comparison unit 144 from the standard signal generating unit 130, lowering the control value set in the voltage impressing unit 120 by 1 (step S107). Through this, the impressed voltage is lowered. When clock division by the second clock divider 143 has not ended (step S105; NO) while clock division by the first clock divider 142 has ended (step S106; YES), this means that division of the clock signal ended faster than division of the standard signal. In this case, as described above, the frequency of the clock signal is higher than the target frequency. For this reason, the frequency comparison unit 144 lowers the control value by one in order to lower the frequency of the clock signal.

In addition, when it is determined that clock division by the second clock divider 143 has ended (step S105; YES), the frequency comparison unit 144 determines whether or not clock division by the first clock divider 142 has ended (step S108). The explanation of this determination is the same as the explanation for step S106.

When it is determined that clock division by the first clock divider 142 has ended (step S108; YES), the frequency comparison unit 144 accomplishes the process in step S102. If clock division by the second clock divider 143 has ended (step S105; YES) and clock division by the first clock divider 142 has ended (step S108; YES), clock division of the clock signal and clock division of the standard signal ended simultaneously. In this case, because the frequency of the clock signal is the same or roughly the same as the target frequency, the frequency comparison unit 144 does not need to change the impressed voltage, so as long as the comparison setting value remains unchanged the processes in steps S103, S104 and S105 are accomplished, clock division starts and the target frequency and the frequency of the clock signal are compared again.

On the other hand, when it is determined that clock division by the first clock divider 142 has not ended (step S108; NO), the frequency comparison unit 144 outputs an instruction to raise the control value by one to the voltage impressing unit 120 and the control value set in the voltage impressing unit 120 is raised by one, under the timing with which the next pulse of the standard signal is supplied to the frequency comparison unit 144 from the standard signal generating unit 130. Through this, the impressed voltage is raised. When clock division by the second clock divider 143 has ended (step S105; YES) and clock division by the first clock divider 142 has not ended (step S108; NO), clock division of the standard signal has ended faster than clock division of the clock signal. In this case, as discussed above, the frequency of the clock signal is lower than the target frequency. Consequently, the frequency comparison unit 144 raises the control value by one in order to increase the frequency of the clock signal.

In this manner, when the comparison setting value is set to "1", the frequency comparison unit 144 successively compares the target frequency and the clock signal frequency and controls the impressed voltage in accordance with the comparison result. Through this, the frequency of the successively generated clock signal is adjusted to be the same or roughly the same as the target frequency. In the discussion above, the first clock divider 142 and the second clock divider 143 accomplish clock division with clock division values respectively set in the first clock divider 142 and the second clock divider 143.

Figure 8:
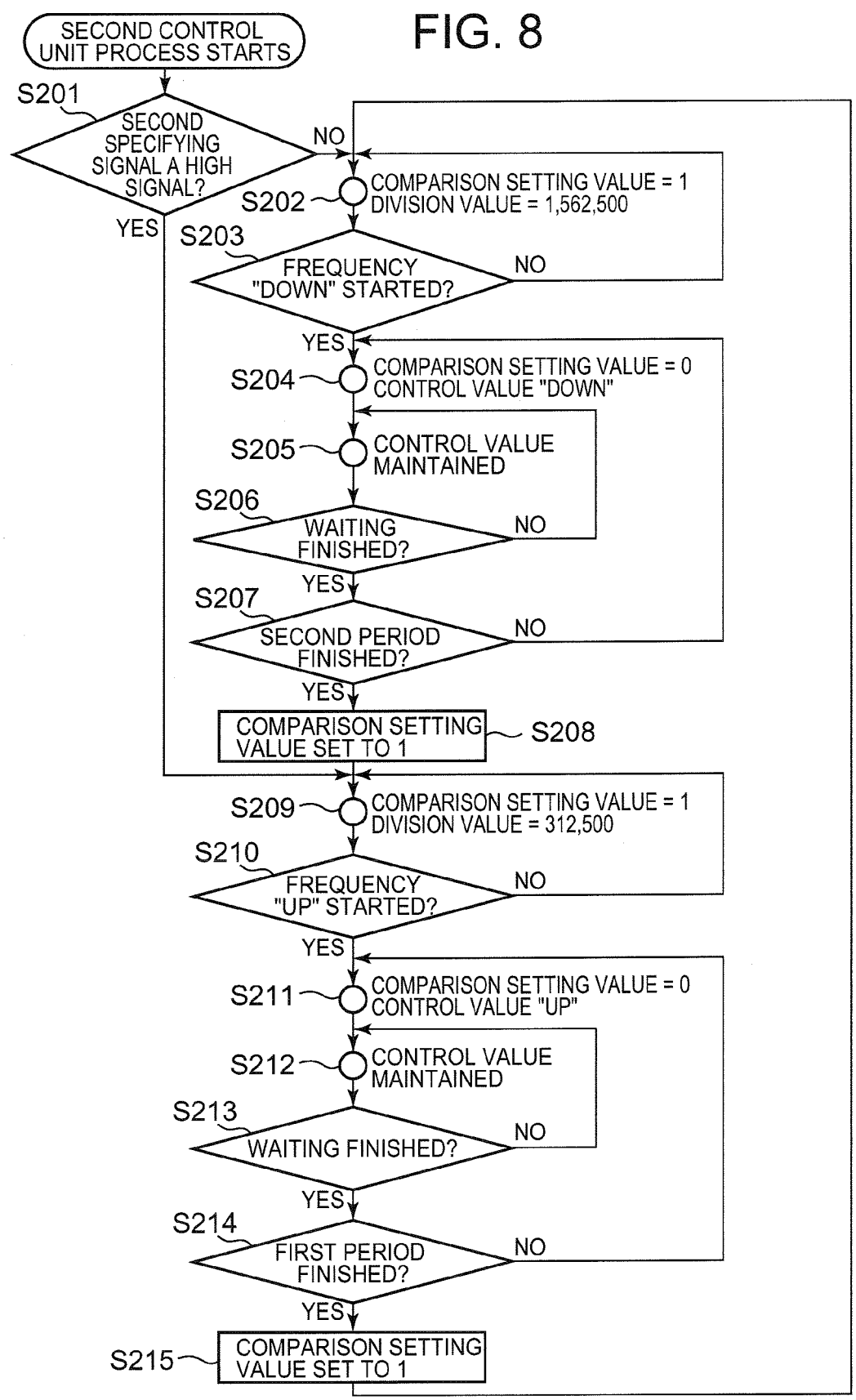
FIG. 8 shows the operation flow accomplished by the second control unit of the clock signal generating device according to the first embodiment of the present invention.

Next, the operation of the second control unit 150 will be explained with reference to FIG. 8. Accompanying the start of operations by the clock signal generating device 100, the second control unit 150 starts the below-described process. As discussed above, the standard signal is supplied to the second control unit 150 from the standard signal generating unit 130.

The second control unit 150 first determines whether or not the second specifying signal supplied to the second control unit 150 is a High signal (step S201). If the second specifying signal is not a High signal (step S201; NO), the second control unit 150 accomplishes the process in step S202. If the second specifying signal is a high signal (step S201; YES), the second control unit 150 accomplishes the process of step S209. In this manner, the second control unit operates in accordance with the target frequency specified by the second specifying signal when the clock signal generating device 100 begins operating.

In step S202, the second control unit 150 waits until the next pulse of the standard signal is supplied to the second control unit 150, and when the next pulse is supplied, accomplishes the process of step S203. Because the comparison setting value set in the frequency comparison unit 144 at this time is "1" and in addition the second specifying signal is a High signal and the first specifying signal is a High signal, the clock division value set in the first clock divider 142 is 1,562,500.

The second control unit 150 determines whether or not to start the process of gradually reducing the frequency in step S203. If a decreasing change is not detected, the second control unit 150 determines to not yet start the process of reducing (step S203; NO), and waits in step S202 before again executing the determination process of step S203. Through this, the second control unit 150 waits until the second control unit 150 determines to start the process of reduction (step S203; YES). While the second control unit 150 is waiting, the first control unit accomplishes control of the impressed voltage (in other words, the frequency of the clock signal). See above for details of this control. The clock division value of the first clock divider 142 is 1,562,500.

When the determination to start the process of reduction is made by a decreasing change being detected (step S203; YES), the second control unit 150 sets "0" in the frequency comparison unit 144 as the comparison setting value with the timing with which the next pulse of the standard signal is supplied to the frequency comparison unit 144 from the standard signal generating unit 130 (as described below, "0" is also set in the voltage impressing unit 120 as a comparison setting value), and along with causing the frequency comparison unit 144 to wait, outputs instructions to lower the control value by one to the voltage impressing unit 120 and lowers the control value set in the voltage impressing unit 120 by one (step S204). Through this, the frequency of the clock signal newly generated by the clock signal generating unit 110 decreases. In this manner, when a decreasing change is detected, the second control unit 150 controls the voltage impressing unit 120 in place of the first control unit 140 and the frequency of the clock signal is lowered.

After the process of step S204, the second control value waits until the next pulse of the standard signal is supplied to the second control unit 150 (step S205) and when the next pulse is supplied accomplishes the process of step S206. At this time, the control value does not change but is stored in the voltage impressing unit 120.

The second control unit determines in step S206 whether or not waiting has ended. The second control unit determines that waiting has ended when, for example, the process in step S205 has been repeated a predetermined number of times (step S206; YES). The second control unit 150 determines that waiting has not ended when, for example, repeating of the process of step S205 is less than the predetermined number of times (step S206; NO).

When it is determined that waiting has not ended (step S206; NO), the second control unit 150 again accomplishes the process of step S205. In this manner, the second control unit 150 waits until a predetermined number of pulses have been supplied. Through this kind of waiting, it is possible to adequately obtain a time interval during which to lower the frequency of the clock signal, and to prevent or reduce the supply destination of the clock signal not following the change in the frequency of the clock signal if the change in frequency is too fast when the frequency of the clock signal has gradually changed. If the supply destination can respond to these changes in frequency even when the frequency of the clock signal is reduced gradually for each one pulse of the standard signal, the processes in steps S205 and S206 may be omitted. In this case, the frequency of the clock signal can rapidly approach the target frequency.

When it is determined that waiting has ended (step S206; YES), the second control unit 150 determines whether or not the second period has ended (step S207). As explained above, the second period is a period predetermined from when a decreasing change is detected, and can be stipulated by the number of times the control value is lowered by one. The second control unit 150 determines that the second period has ended when, for example, the process in step S204 has been repeatedly accomplished a predetermined number of times (207 times) (step S207; YES), and determines that the second period has not ended when the number of times the process of step S207 has been executed is less than the predetermined number of times (step S207; NO).

When it is determined that the second period has not ended (step S207; NO), the second control unit 150 again accomplishes the process of step S204. In this manner, the second control unit 150 lowers the frequency of the clock signal by a predetermined change value during the second period and with a predetermined time interval.

When it is determined that the second period has ended (step S207; YES), the second control unit 150 sets "1" as the comparison setting value in the frequency comparison unit 144 (and the voltage impressing unit 120) (step S208). Through this, the second control unit 150 causes control of the impressed voltage to be accomplished by the first control unit 140 after the second period has elapsed. The second control unit 150 accomplishes the process in step S209 after the process in step S208.

In step S209, the second control unit 150 waits until the next pulse of the standard signal is supplied to the second control unit 150 and when the next pulse has been supplied accomplishes the process of step S210. The comparison setting value set in the frequency comparison unit 144 at this time is 1, and in addition the second specifying signal is a Low signal and the first specifying signal is a Low signal, so the clock division value set in the first clock divider 142 is 312, 500.

The second control unit 150 determines in step S210 whether or not the process of gradually increasing the frequency has been started. If an increasing change has not been detected, the second control unit 150 determines that the process of increasing has not yet started (step S210; NO), and waits in step S209 before again accomplishing the determination process of step S210. Through this, the second control unit 150 waits until the determination is that the second control unit has begun the process of reduction in step S210 (step S210; YES). While the second control unit 150 is waiting, the first control unit accomplishes control of the impressed voltage (that is to say, the frequency of the clock signal). See above for details of this control. The clock division value of the first clock divider 142 is 312,500.

When the determination to start the process of increasing is made by an increasing change being detected (step S210; YES), the second control unit 150 sets "0" in the frequency comparison unit 144 as the comparison setting value with the timing with which the next pulse of the standard signal is supplied to the frequency comparison unit 144 from the standard signal generating unit 130 (as described below, "0" is also set in the voltage impressing unit 120 as a comparison setting value), and along with causing the frequency comparison unit 144 to wait, outputs instructions to raise the control value by one to the voltage impressing unit 120 and raises the control value set in the voltage impressing unit 120 by one (step S211). Through this, the frequency of the clock signal newly generated by the clock signal generating unit 110 increases. In this manner, when an increasing change is detected, the second control unit 150 controls the voltage impressing unit 120 in place of the first control unit 140 and the frequency of the clock signal is raised.

After the process of step S211, the second control value waits until the next pulse of the standard signal is supplied to the second control unit 150 (step S212) and when the next pulse is supplied accomplishes the process of step S213. At this time, the control value does not change but is stored in the voltage impressing unit 120.

The second control unit determines in step S213 whether or not waiting has ended. The second control unit 150 determines that waiting has ended when, for example, the process in step S212 has been repeated a predetermined number of times (step S213; YES). The second control unit 150 determines that waiting has not ended when, for example, repeating of the process of step S212 is less than the predetermined number of times (step S213; NO).

When it is determined that waiting has not ended (step S213; NO), the second control unit 150 again accomplishes the process of step S212. In this manner, the second control unit 150 waits until a predetermined number of pulses have been supplied. Through this kind of waiting, it is possible to adequately obtain a time interval during which to lower the frequency of the clock signal, and to prevent or reduce the supply destination of the clock signal not following the change in the frequency of the clock signal if the change in frequency is too fast when the frequency of the clock signal has gradually changed. If the supply destination can respond to these changes in frequency even when the frequency of the clock signal is increased gradually for each one pulse of the standard signal, the processes in steps S212 and S213 may be omitted. In this case, the frequency of the clock signal can rapidly approach the target frequency.

When it is determined that waiting has ended (step S213; YES), the second control unit 150 determines whether or not the first period has ended (step S214). As explained above, the first period is a period predetermined from when an increasing change is detected, and can be stipulated by the number of times the control value is raised by one. The second control unit 150 determines that the first period has ended when, for example, the process in step S211 has been repeatedly accomplished a predetermined number of times (207 times) (step S214; YES), and determines that the first period has not ended when the number of times the process of step S207 has been executed is less than the predetermined number of times (step S214; NO).

When it is determined that the first period has not ended (step S214; NO), the second control unit 150 again accomplishes the process of step S211. In this manner, the second control unit 150 lowers the frequency of the clock signal by a predetermined change value during the first period and with a predetermined time interval.

When it is determined that the first period has ended (step S214; YES), the second control unit 150 sets "1" as the comparison setting value in the frequency comparison unit 144 (and the voltage impressing unit 120) (step S208). Through this, the second control unit 150 causes control of the impressed voltage to be accomplished by the first control unit 140 after the first period has elapsed. The second control unit 150 accomplishes the process in step S202 after the process in step S215.

Figure 9:
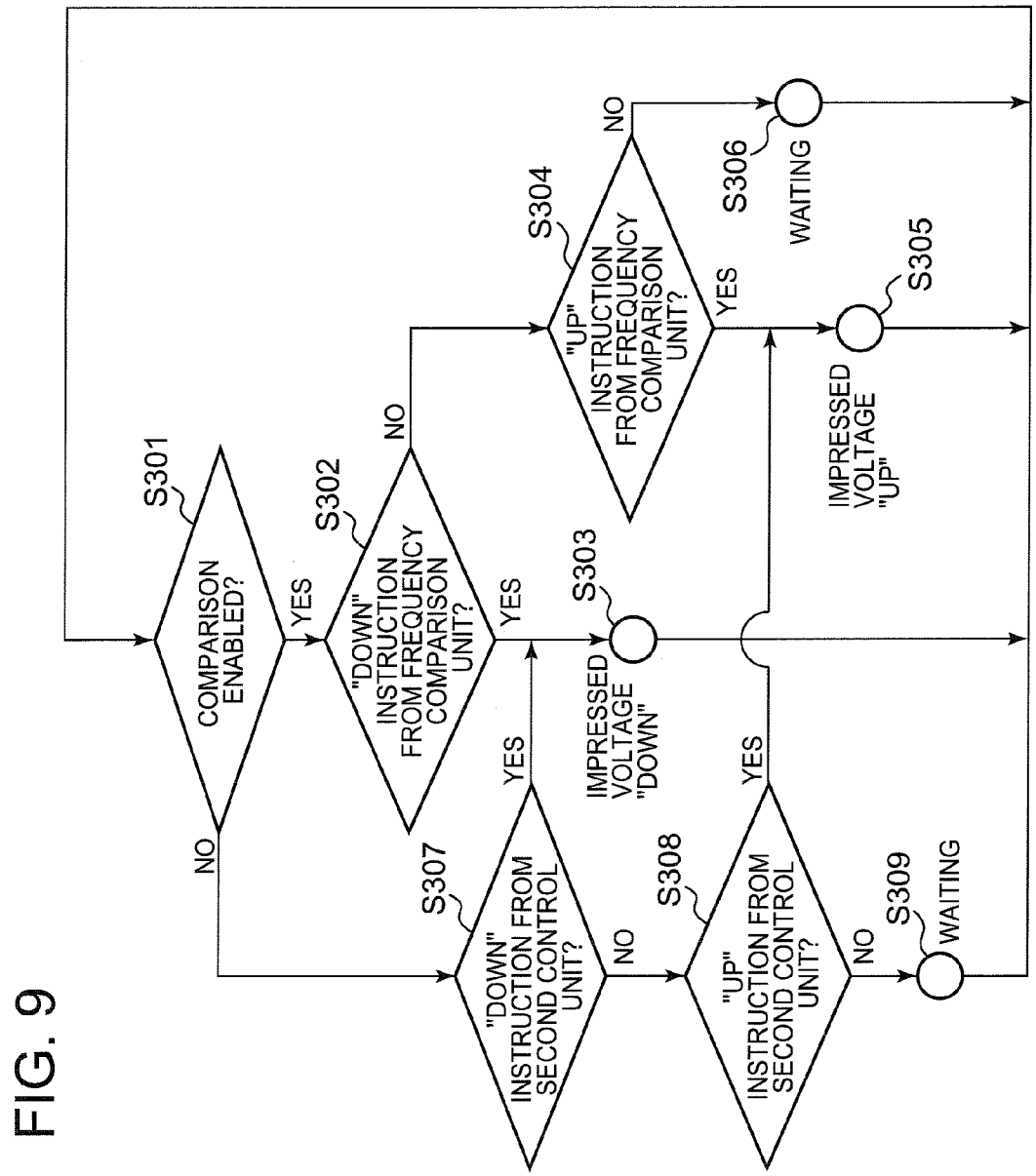
FIG. 9 shows the operation flow accomplished by the voltage impressing unit of the clock signal generating device according to the first embodiment of the present invention.

Next, the operation of the voltage impressing unit 120 will be explained with reference to FIG. 9. The voltage impressing unit 120 starts below-described operations when the signal generating device begins operations. As noted above, the standard signal is supplied from the standard signal generating unit 130 to the second control unit 150. In addition, the operations of the voltage impressing unit 120 start when the operations of the clock signal generating device 100 start, for example from step S301.

The voltage impressing unit 120 determines whether to enable comparison (step S301). If, for example, "1" is set as the comparison setting value in the voltage impressing unit 120, the determination here is YES (step S301; YES). If, for example, "0" is set as the comparison setting value in the voltage impressing unit 120, the determination here is NO (step S301; NO).

When the determination is YES with regard to enabling comparison (step S301; YES), in other words when "1" is set as the comparison setting value, the voltage impressing unit is controlled by the frequency comparison unit 144. Furthermore, in this case the determination is made as to whether or not there is an instruction from the frequency comparison unit 144 to lower the control value by 1 (an instruction to lower the impressed voltage) (step S302).

When there is an instruction from the frequency comparison unit 144 to lower the control value by 1 (step S302; YES), the voltage impressing unit 120 accomplishes the process of step S303.

In the process of step S303, the voltage impressing unit 120 lowers the control value by one with the timing with which the next pulse of the standard signal is supplied, and lowers the voltage impressed on the clock signal generating unit 110.

Through this, the frequency of the newly generated clock signal is lowered. Following this, the voltage impressing unit 120 accomplishes the process of step S301.

When there is no instruction from the frequency comparison unit 144 to lower the control value by 1 (step S302; NO), the voltage impressing unit 120 determines whether or not there is an instruction from the frequency comparison unit 144 to raise the control value by 1 (an instruction to raise the impressed voltage) (step S304).

When there is an instruction from the frequency comparison unit 144 to raise the control value by 1 (step S304; YES), the voltage impressing unit 120 accomplishes the process of step S305.

In the process of step S305, the voltage impressing unit 120 raises the control value by one with the timing with which the next pulse of the standard signal is supplied, and raises the voltage impressed on the clock signal generating unit 110. Through this, the frequency of the newly generated clock signal is raised. Following this, the voltage impressing unit 120 accomplishes the process of step S301.

When there is no instruction from the frequency comparison unit 144 to raise the control value by 1 (step S304; NO), the voltage impressing unit 120 accomplishes the process of step S306. At this time, no instruction to change the control value has come from the frequency comparison unit 144.

In the process of step S306, the voltage impressing unit 120 waits until the next pulse of the standard signal is supplied to the voltage impressing unit 120, and when the next pulse is supplied again accomplishes the process of step S301.

When the determination is NO with regard to enabling comparison (step S301; NO), in other words when "0" is set as the comparison setting value, the voltage impressing unit 120 is controlled by the second control unit 150. Furthermore, in this case the determination is made as to whether or not there is an instruction from the second control unit 150 to lower the control value by 1 (an instruction to lower the impressed voltage) (step S307).

When there is an instruction from the second control unit 150 to lower the control value by 1 (step S307; YES), the voltage impressing unit 120 accomplishes the process of step S303.

When there is no instruction from the second control unit 150 to lower the control value by 1 (step S307; NO), the voltage impressing unit 120 determines whether or not there is an instruction from the second control unit 150 to raise the control value by 1 (an instruction to raise the impressed voltage) (step S308).

When there is an instruction from the second control unit 150 to raise the control value by 1 (step S308; YES), the voltage impressing unit 120 accomplishes the process of step S305.

When there is no instruction from the second control unit 150 to raise the control value by 1 (step S308; NO), the voltage impressing unit 120 accomplishes the process of step S309. At this time, no instruction to change the control value has come from the second control unit 150.

In the process of step S309, the voltage impressing unit 120 waits until the next pulse of the standard signal is supplied to the voltage impressing unit 120, and when the next pulse is supplied again accomplishes the process of step S301.

In this manner, the voltage impressing unit 120 is controlled by the frequency comparison unit 144 (the first control unit 140) and the second control unit 150 and the frequency of the clock signal is appropriately increased or decreased.

As shown above, in the clock signal generating device 100 according to the present embodiment a target frequency is set (in the present embodiment, the first specifying signal and the second specifying signal are supplied).

In addition, the clock signal generating device 100 according to the present embodiment is provided with a clock signal generating unit 10 on which voltages are successively impressed and which successively generates clock signals having frequencies corresponding to the successively impressed voltages.

In addition, the clock signal generating device 10 according to the present embodiment is provided with a first control unit 140 that compares the target frequency and the frequency of the clock signal generated by the clock signal generating unit 110, and on the basis of the results of this comparison (the comparison results), controls the impressed voltage so that the frequency of the clock signal newly generated by the clock signal generating unit becomes the target frequency.

In addition, the clock signal generating device 100 according to the present embodiment is provided with a second control unit 150 which, when the target frequency is changed, successively changes the impressed voltage and causes the frequency of the clock signal newly generated by the clock signal generating unit 110 to approach the target frequency by means of a preset interval (here, an interval corresponding to the frequency of the standard signal) within a preset period (here, the first period or the second period) along with a preset change value (here, the change value of the impressed voltage corresponding to the change in the control value. This change value need not be one that causes the impressed voltage to change uniformly successively).

With the above composition, the clock signal generating device 100 according to the present embodiment is such that the second control unit 150 forcibly causes the frequency of the clock signal to change when the target frequency is changed, so it is possible to cause the frequency of the clock signal to forcibly approach the target frequency and the time during which the frequency of the clock signal approaches the post-change target frequency is short.

If the first control unit 140 were to control this process, the impressed voltage would be controlled after accomplishing a comparison between the frequency of the clock signal and the target frequency, so it would take time for the above-described excess comparisons. For example, as described above, by the second control unit 150 causing the control value to change 207 times each one period of the standard signal, the time required when changing the impressed voltage and changing frequency of the clock signal is $\frac{1}{32.768}$ KHz×207=6.3 ms. If the first control unit 140 were to accomplish this process, it would be necessary to compare the target frequency and the frequency of the clock signal each time the control value changed by one, in other words it would be necessary to divide the clock signal by 1,000, so the required time would be $\frac{1}{32.768}$ KHz×1000×207=6.3 s.

Thus, with the clock signal generating device 100 according to the present embodiment, it is possible to cause the frequency of the clock signal to approach the post-change target frequency in a short time.

In addition, because the impressed voltage is successively changed under preset conditions, it is possible to prevent or mitigate rapid changing of the frequency of the clock signal, so it is possible to prevent operation of the supply destinations of the clock signal from becoming unstable.

As discussed above, with the clock signal generating device 100 according to the present embodiment, it is possible to change the predetermined frequency of the clock signal in a short time, making it possible to prevent or mitigate operation of the supply destinations of the clock signal from becoming unstable (including stopping) when the frequency of the clock signal changes. In addition, with the clock signal generating device 100 according to the present embodiment, stopping of the operations of the supply destinations is eliminated or becomes fewer in number, so the supply destinations need not be reset or can be reset a fewer number of times.

The operation timing of the second control unit 150 is dependent on the standard signal, but with the clock signal generating device 100 according to the present embodiment as discussed above, it is possible to have the frequency of the clock signal approach the post-change target frequency in a short time, so it is possible to lower the frequency of the target signal. Consequently, it is possible to use a signal with low frequency as the standard signal. Consequently, it is possible to suppress power consumption by the standard signal generating unit 130. Power consumption by the standard signal generating unit 130 increases the higher the frequency of the standard signal generated.

In addition, the first control unit 140 further accomplishes control of the impressed voltage using the post-change target frequency after the second control unit 150 accomplishes the process of successively changing the impressed voltage within a preset period, so after the frequency of the successively generated clock signal has approached the target frequency, the frequency of the clock signal does not greatly blur. That is because the first control unit 140 compares the frequency of the clock signal and the target frequency to control the frequency of the clock signal.

The clock signal generating device 100 according to the present embodiment comprises an electronic device along with a processing device to which the clock signal generated by this device is supplied and which uses the supplied clock signal as an operating clock signal. The electronic device is, for example, a control unit of a computer or the like, various types of computers or various types of printers 900 (printing devices). In the present embodiment, an example was exhibited in which a printer 900 was utilized as the electronic device.

The composition of the printer 900 is explained simply below with reference to FIG. 10.

The printer has, for example, the clock signal generating device 100, a CPU 901, a memory 902, a data transfer control unit 904, a print device engine 905, an operation panel 903 and a receiver 906, and is connected to a LAN 907 (Local Area Network).

The CPU 901 controls the various constituent elements of the printer 900. The CPU 901 operates on the basis of program instructions in the memory 902.

Various types of data, such as the aforementioned programs, printing data and the like, are stored in the memory 902.

The data transfer control unit 904 successively requests part of the print data from the CPU 901 (for example, data for a series of pixels in the image) when printing starts. The CPU 901, in accordance with these requests, reads part of the print data from the memory 902 and supplies this to the data transfer control unit 904. The data transfer control unit 904 successively changes part of the print data to a preset control signal and successively supplies this to the print engine 905.

The print engine 905 has various types of printer heads, print drums and the like, and prints an image expressing the aforementioned print data on paper or the like on the basis of the control signal supplied from the data transfer control unit 904.

The operation panel 903 displays an operation screen, receives operations from the user and supplies operation signals corresponding to the received operations to the CPU 901.

The CPU 901 accomplishes predetermined processes in accordance with the supplied operation signals.

Predetermined print data is supplied from the LAN 907. The print data supplied from the LAN 907 is supplied to the printer 900 via a receiver 906, and the CPU 901 stores this data in the memory 902.

The clock signal generating device 100 generates a clock signal and supplies the generated clock signal to the CPU 901. The CPU 901 uses this clock signal as an operating clock. The CPU 901 supplies a first specifying signal and a second specifying signal specifying target frequencies to the clock signal generating device 100. By supplying the first specifying signal and the second specifying signal to the clock signal generating device 100, the target frequency is set in the clock signal generating device 100. The clock signal generating device 100 operates so as to generate and output a clock signal for the set target frequency. In this manner, the CPU 901 designates the frequency of the clock signal.

When printing or the like is not undertaken, the printer 900 is in a sleep state (print standby state). At this time, the CPU 901 halts operation of the data transfer control unit 904 and the like, reducing the power consumption of the printer 900. The frequency of the operating clock of the CPU 901 at this time need not be high, so the CPU 901 requests a low target frequency (for example, 10 MHz as mentioned above) from the clock signal generating device 100. In other words, the CPU 901 supplies the first specifying signal and the second specifying signal specifying 10 MHz to the clock signal generating device 100. Through this, the clock signal generating device 100 operates so as to generate and output a 10 MHz clock signal.

When the printer 900 is in a sleep state, the CPU 901 constantly receives operations from the operation panel 903 or print data supplied from the LAN 907 via the receiver 906.

When the operation panel 903 is operated or print data is supplied from the LAN 907, the printer enters an operating state and begins printing. At this time, the CPU 901 causes the data transfer control unit 904 and the like to operate, so it is necessary for the frequency of the operating clock to be high. Consequently, the CPU 901 requests a high target frequency (for example, 50 MHz as mentioned above) from the clock signal generating device 100. In other words, the CPU 901 supplies the first specifying signal and the second specifying signal specifying 50 MHz to the clock signal generating device 100. Through this, the clock signal generating device 100 operates so as to generate and output a 50 MHz clock signal When the printer is in an operating state, the CPU 901 instructs the data transfer control unit 904 to begin printing, and the data transfer control unit 904 successively requests part of the print data from the CPU 901 with the start of printing. Through this, printing is started.

The transition from sleep state to operating state in the printer 900 is preferably accomplished in a short time. Furthermore, instability in (including stopping of) operation of the CPU 901 and the like should naturally be avoided. When the CPU 901 becomes unstable during printing, the necessity of restarting the printer arises. As a result of restarting, loss of printing data during printing can arise, and in some cases printing many not proceed well.

By using the clock signal generating device 100 according to the present embodiment in the printer 900, as discussed above when the target frequency is changed it is possible with this clock signal generating device 100 to cause the frequency of the clock signal to become or approach the target frequency in a short time without causing instability in the operation of the CPU 901 or the like, or minimizing instability. Consequently, loss of printing data by this printer 900 during printing can be prevented or mitigated. In addition, because it is possible for the frequency of the clock signal to become or approach the target frequency in a short time, the CPU 901 can return to the operating state promptly even when operating under a clock signal of low frequency when in the sleep state. Consequently, it is possible to adopt a low frequency as the target frequency of the clock signal during the sleep state and through this to reduce poser consumption by the printer 900 in the sleep state.

The clock signal generating device 100 according to the present embodiment is not limited to a printer 900, but can be used in a computer or other electronic device that can assume difference states such as an operating state and a standby state. With an electronic device that utilizes the clock signal generating device 100 according to the present embodiment, the same effects as described above (eliminating or mitigating data loss and instability of the CPU 901 and the like, quick return to operating state, reduction of power consumption and so forth) can be obtained.

The present invention is not limited to the above-described embodiment, for a variety of variations is possible. Examples of these are illustrated below. Even with the below variations, the effects explained above can be obtained.

(1) The clock signal generating unit 110 may increase the frequency of the generated clock signal in accordance with reduction of the impressed voltage. In this case, handling of increases and decreases in the impressed voltage would be reversed.

(2) The voltage impressing unit 120 may reduce the voltage impressed on the clock signal generating unit 110 as the set control value becomes larger. In this case, handling of the control value and the impressed voltage would be reversed.

(3) In the above-described embodiment, the first control unit 140 controls the voltage impressed on the clock signal generating unit 110 via the voltage impressing unit 120, but the first control unit 140 may directly control the voltage impressed on the clock signal generating unit 110.

(4) In the above-described embodiment, the second control unit 150 controls the voltage impressed on the clock signal generating unit 110 via the voltage impressing unit 120, but the second control unit 150 may directly control the voltage impressed on the clock signal generating unit 110.

Figure 11:
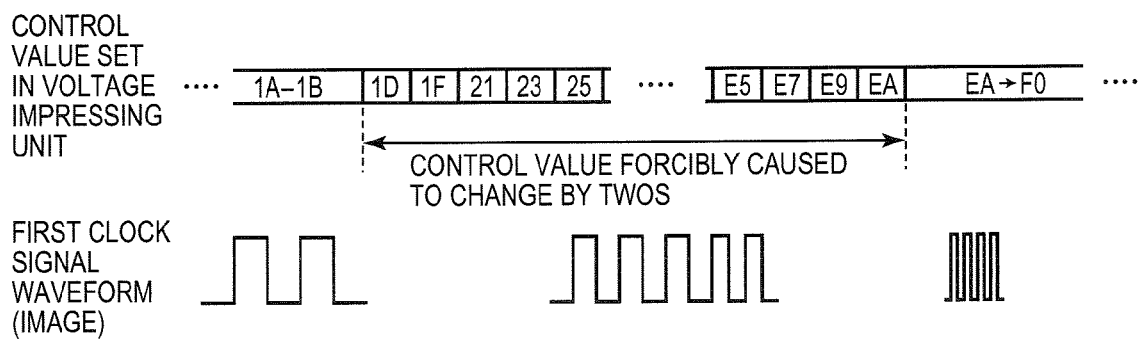
FIG. 11 is a schematic drawing explaining the process (a process corresponding to an increasing change in the target frequency) accomplished by a second control unit of the clock signal generating device according to a variation of the first embodiment of the present invention.

(5) The second control unit 150 changes the control value one by one, but it would be fine to change the control value by a value of two or more (a value larger than the smallest unit value the control value takes) (see FIG. 11). Through this, the second control unit 150 can more quickly get the frequency of the clock signal to approach the target frequency. However, as the change value of the control value becomes large, the change in the frequency of the clock signal also becomes larger, but if the change in the frequency becomes large, this could have adverse effects on the supply destinations of the clock signal. Consequently, what value to change the control value with when the control value is changed with a value of two or more is determined based on the supply destinations of the clock signal.

(6) The method the first control unit 140 uses to compare the target frequency with the frequency of the clock signal generated by the clock signal generating unit 110 may be a different method.

(7) The method the second control unit 150 uses for successively changing the impressed voltage by means of a preset change value and with a preset interval within a preset time in place of the first control unit 140 when the target frequency is changed may be a different method.

(8) The clock signal may use the period of the processing device of the like (in the description above, this is a square wave).

With the clock signal generating device 100, an electronic device provided with the clock signal generating device 100 and a PLL control device having the same composition as the clock signal generating device 100 according to the present invention, the frequency of a predetermined clock signal can be changed in a short time, preventing or mitigating instability of operations in the supply destinations of the clock signal when changing the frequency of the clock signal.

(Second Embodiment)

Next, the composition of a clock signal generating device 200 according to a second embodiment will be described with reference to FIG. 12. The constituent elements of the clock signal generating device 200 are comprised of electronic circuits and the like. In addition, the clock signal generating device 200 is, for example, applied to the printer 900 shown in FIG. 2 and used in place of the clock signal generating device 100.

A target frequency is set in the clock signal generating device 200, and the clock signal generating device 200 operates so as to generate a first clock signal (clock pulse) having the set target frequency. The first clock signal generated by the clock signal generating device 200 is supplied to supply destinations such as processing devices that accomplish predetermined processes, such as a CPU (Central Processing Unit) or the like. The target frequency is a frequency requested as the frequency of the first clock signal generated by the clock signal generating device 200, and is a frequency needed by the supply destinations. The supply destinations use the first clock signal as an operating clock signal, for example. The clock signal generating device 200 may be built into the above-described processing devices and the like, for example. In this case, the parts in this processing device other than the clock signal generating device 200 are appropriately expressed as external parts to the clock signal generating device 200.

The clock signal generating device 200 has a first control unit 201, a second control unit 203, a first counter 205, a second counter 207, a standard signal generating unit 209, a setting unit 211, a D/A (digital/analog converter) 213, a clock signal generating unit 215, a first selector 217, a register 219, a register 221, a register 223, a register 225, a second selector 227, a register 229 and a register 231.

A first control signal designating the target frequency is supplied from outside (for example, the above-described supply destinations) to the first control unit 201. In the present embodiment, by the first control signal being supplied to the first control unit 201, a target frequency designated by this control signal is set in the first control unit 201. The first control unit 201 controls the second control unit 201 and controls the setting unit 211 so that the frequency of the first clock signal becomes the set target frequency. Furthermore, the first control unit 201 controls the first selector 217 and the second selector 227. By controlling the first selector 217 and the second selector 227 in accordance with the set target frequency, the first control unit 201 sets a first setting number and a second setting number in accordance with the set target frequency in the first counter 205 and the second counter 207, respectively.

The second control unit 203 controls the first counter 205 and the second counter 207 and causes the first counter 205 and the second counter 207 to count the number of pulses equal to the first setting number and the second setting number, respectively, compares the timing of ending counting of the first setting number in the first counter 205 and the timing of ending counting of the second setting number in the second counter 207, and accomplishes control of the setting unit 211 in accordance with the comparison results. This control is accomplished for example by supplying a second control signal indicating instructions in accordance with the comparison results to the setting unit 211.

This second control signal is supplied to the first control unit 201 as well. The first control unit 201 controls the first selector 217 and the second selector 227 on the basis of the second control signal, and changes the first setting number and the second setting number respectively set in the first counter 205 and the second counter 207.

The setting unit 211 sets a predetermined setting value in the D/A 213 on the basis of the second control signal supplied from the second control unit 203, that is to say on the basis of control by the second control unit 203. In addition, the setting unit 211 is controlled by the first control unit 201 in place of the second control unit 203 with an appropriate timing and sets a predetermined setting value in the D/A 213 on the basis of control by the first control unit 201. In particular, the setting unit 211 stores the setting value set in the D/A 213, and changes the setting value set in the D/A 213 by setting in the D/A 213 a setting value that is the setting value set in the D/A 213 changed by a predetermined value (here, 1) on the basis of control by the second control unit 203.

The D/A 213 impresses on the clock signal generating unit 215 a voltage having a voltage value in accordance with the setting value set by the setting unit 211. In order to simplify this explanation, this setting value is here taken to be the value 01 through FF in hexadecimal, but the obtained value can be appropriately changed and could take on a larger range of values, for example.

The clock signal generating unit 215 generates the first clock signal having a frequency of a size in accordance with the voltage value of the voltage that is impressed (the impressed voltage) and outputs this to the outside.

The first selector 217 is controlled by the first control unit 201 and sets a value stored in any out of the register (for example, comprised of flip-flops or the like. The same for registers) 219, the register 221, the register 223 or the register 225 in the first counter 205 as the first setting number. Predetermined values are stored in the register 219, the register 221, the register 223 and the register 225, respectively. These values are supplied from the above-described supply destinations and stored.

The first clock signal is supplied to the first counter 205. The first counter counts the number of pulses of the first clock signal supplied up to the first setting number set in the first counter 205 under control from the second control unit 203, and when the first setting number has been counted (when counting is finished), notifies the second control unit 203 that counting is finished.

The first counter 205 is composed, for example, of clock dividers that divide the frequency of the supplied first clock signal by the first setting number. Here, the first setting number is the division ratio. The first counter 205 supplies the signal after clock division to the second control unit 203. The second control unit 203 detects that counting is finished in that the pulses of the first clock signal have been counted up to the first setting number when one period of pulse signals have been supplied (for example, when the time from the rising edge of a pulse to the rising edge of the next is detected). In this manner, the second control unit 203 is notified of the finishing of counting by one period of pulse signals being supplied to the second control unit 203.

The standard signal generating unit 209 generates a second clock signal (clock pulse) that is a standard signal having a standard frequency. The standard signal generating unit 230 outputs the generated second clock signal. The standard signal generating unit 230 is composed of a standard clock generator that includes a crystal oscillator and an oscillator circuit. In the present embodiment, the frequency of the second clock signal is taken to be 32 kHz.

The second selector 227 is controlled by the first control unit 201 and sets in the second counter 207 as the second setting number the value stored in either the register 229 or the register 231. Predetermined values are respectively stored in the register 229 and the register 231. These values are stored by the above-described supply destinations, for example.

The second clock signal is supplied to the second counter 207. The second counter 207, under control by the second control unit 203, counts the number of pulses of the supplied second clock signal up to the second setting number set in the second counter 207 and when counting is finished provides notification that counting is finished by supplying a predetermined signal to the second control unit 203.

The second counter 207 is composed, for example, of a clock divider that divides the frequency of the supplied second clock signal by the second setting number. The second counter 207 supplies the signal after clock division to the second control unit 203. The second control unit 203 detects that counting is finished by the pulses of the second clock signal being counted up to the second setting number when one period of the pulse signal is supplied (for example, when the time from the rising edge of a pulse to the rising edge of the next is detected). In this manner, the second control unit 203 is notified of the finishing of counting by one period of pulse signals being supplied to the second control unit 203.

In addition, the standard signal generating unit 209 supplies the second clock signal to the first control unit 201, the second control unit 203 and the setting unit 211. Synchronization of the first control unit 201, the second control unit 203 and the setting unit 211 is achieved through the second clock signal. In other words, the second clock signal is used as the operating clock of the first control unit 201, the second control unit 203 and the setting unit 211.

In the present embodiment, the target frequency is 40 MHz or 16 MHz. The first control signal is a signal designating 40 MHz and 16 MHz as the target frequency. The first control signal is either a High signal or a Low signal, with the High signal designation 40 MHz and the Low signal designating 16 MHz. In other words, either 40 MHz or 16 MHz is designated as the target frequency by the first control signal being a High signal or a Low signal.

In addition, the first setting number and the second setting number are respectively numbers when the first counter 205 and the second counter 207 simultaneously finish counting the first setting number and counting the second setting number simultaneously from the start of counting of the number of pulses, when the frequency of the first clock signal is the target frequency designated by the control signal. The target frequency of the first clock signal is fundamentally different from the below-described frequency of the second clock signal, so the first setting number and the second setting number are fundamentally different numbers.

In the present embodiment, the value "32,000" ("7D00" in hexadecimal) is stored in the register 219, the value "512,000" ("7D000" in hexadecimal) is stored in the register 221, the value "80,000" ("13880" in hexadecimal) is stored in the register 223 and the value "1,280,000" ("138800" in hexadecimal) is stored in the register 225 as candidates for the first setting number.

In addition, in this embodiment, the value "64" ("7D00" in hexadecimal) is stored in the register 229 and the value "1,024" ("7D000" in hexadecimal) is stored in the register 231 as candidates for the second setting number.

The first control unit 201 controls the first selector 217 and the second selector 227, and when the target frequency is 40 MHz, the value "1,280,000" in the register 225 is set in the first counter 205 as the first setting value and the value "1,024" in the register 231 is set in the second counter 207 as the second setting value.

In addition, the first control unit 201 controls the first selector 217 and the second selector 227, and when the target frequency is 40 MHz, the value "80,000" in the register 223 is set in the first counter 205 as the first setting value and the value "64" in the register 231 is set in the second counter 207 as the second setting value. This value is a value set before the values of "1,280,000" and "1,024" are set when the target frequency changes from 16 MHz to 40 MHz. (described in detail below).

By setting the above values, in the case where the frequency of the first clock signal is the target frequency of 40 MHz, when counting of one setting number of pulses of the first clock signal and counting of the second setting number of pulses of the second clock signal are started simultaneously, these counts end simultaneously.

In addition, the first control unit 201 controls the first selector 217 and the second selector 227, and when the target frequency is 16 MHz, the value "512,000" in the register 221 is set in the first counter 205 as the first setting value and the value "1,024" in the register 231 is set in the second counter 207 as the second setting value.

In addition, the first control unit 201 controls the first selector 217 and the second selector 227, and when the target frequency is 16 MHz, the value "32,000" in the register 219 is set in the first counter 205 as the first setting value and the value "64" in the register 229 is set in the second counter 207 as the second setting value. This value is a value set before the values of "512,000" and "1,024" are set when the target frequency changes from 40 MHz to 16 MHz. (described in detail below).

By setting the above values, in the case where the frequency of the first clock signal is the target frequency of 16 MHz, when counting of one setting number of pulses of the first clock signal and counting of the second setting number of pulses of the second clock signal are started simultaneously, these counts end simultaneously.

The second control unit 203 controls the first counter 205 and the second counter 207, causes counting to start simultaneously and determines which finishes counting first (which provides notification of counting being finished). In other words, the time to finish counting is compared. Through this, the frequency of the first clock signal and the target frequency are compared. The second control unit 203 controls the setting unit 211 in accordance with the comparison results compared, and controls the impressed voltage on the clock signal generating unit 215 (voltage control process). The clock signal generating unit 215 generates and outputs a first clock signal having a frequency corresponding to the impressed voltage, so by controlling the impressed voltage, the frequency of the first clock signal is controlled so as to become the target frequency.

The principle of this control is explained with reference to FIG. 13. In the present embodiment, the D/A 213 increases the voltage value of the impressed voltage impressed on the clock signal generating unit 215 when the set setting value becomes larger, and decreases the voltage value of the impressed voltage impressed on the clock signal generating unit 215 when the set setting value becomes smaller. When the voltage value of the impressed voltage becomes larger, the clock signal generating unit 215 generates a frequency for the first clock signal newly generated in accordance with this. When the voltage value of the impressed voltage becomes smaller, the clock signal generating unit 215 generates a first clock signal with a small frequency.

As described above, the first setting value and the second setting value are values such that when the frequency of the first clock signal is the target frequency, counting of the first setting number and counting of the second setting number in the first counter 205 and the second counter 207 finish simultaneously. Consequently, when counting finishes simultaneously, the frequency of the first clock signal is the target frequency (even in cases with moderate errors). At this time, it is not necessary to change the frequency of the first clock signal. Consequently, when the second control unit 203 is notified that counting is finished simultaneously from both the first counter 205 and the second counter 207 (including roughly simultaneously), the second control signal is not supplied to the setting unit 211 and the setting unit 211 does not change the setting value set in the D/A 213.

When the first counter 205 finishes counting first, the frequency of the first clock signal is higher than the target frequency. In this case, the second control unit 203 supplies the second control signal indicating instructions to lower the setting value to the setting unit 211. When this second control signal is supplied, the setting unit 211 lowers the setting value currently set in the D/A 213 by 1. In this manner, the second control unit 203 controls the setting unit 211 and lowers the setting value set in the D/A 213 by 1 in order to lower the frequency of the first clock signal. As discussed above, if the setting value decreases, the impressed voltage decreases and the frequency of the first clock signal newly generated by the clock signal generating unit 201 decreases, approaching the target frequency.

When the second counter 207 finishes counting first, the frequency of the first clock signal is lower than the target frequency. In this case, the second control unit 203 supplies the second control signal indicating instructions to raise the setting value to the setting unit 211. When this second control signal is supplied, the setting unit 211 raises the setting value currently set in the D/A 213 by 1. In this manner, the second control unit 203 controls the setting unit 211 and raises the setting value set in the D/A 213 by 1 in order to raise the frequency of the first clock signal. As discussed above, if the setting value increases, the impressed voltage increases and the frequency of the first clock signal newly generated by the clock signal generating unit 201 increases, approaching the target frequency.

The second control unit 203 repeatedly accomplishes comparison of frequencies and control of impressed voltage, as discussed above. Through this, the frequency of the first clock signal successively generated by the clock signal generating unit 210 gradually approaches the target frequency and is adjusted to become the target frequency.

The larger the number of pulses counted by the first counter 205 and the second counter 207 (the first setting number and the second setting number), the more accurate the comparison between the frequency of the first clock signal and the target frequency. This is because there are discrepancies in the rising edge of pulses of the first clock signal after counting starts and the rising edge of pulses of the second clock signal, and the effect of these discrepancies becomes smaller in the count the larger the first setting number and the second setting number. If the accuracy of comparison is increased, the frequency of the first clock signal matches the target frequency with good accuracy. On the other hand, when the number of pulses counted is small, that alone makes counting finish quickly, so the comparison ends quickly and it is possible to quickly control the frequency of the first clock signal but the accuracy of comparison drops. This is because the effects of the aforementioned discrepancies are more readily expressed.

The first control unit 201 accomplishes a predetermined operation when the target frequency specified by the first control signal supplied is changed, that is to say when the target frequency set is changed. An example of this operation is explained with reference to FIG. 14.

Figure 14:
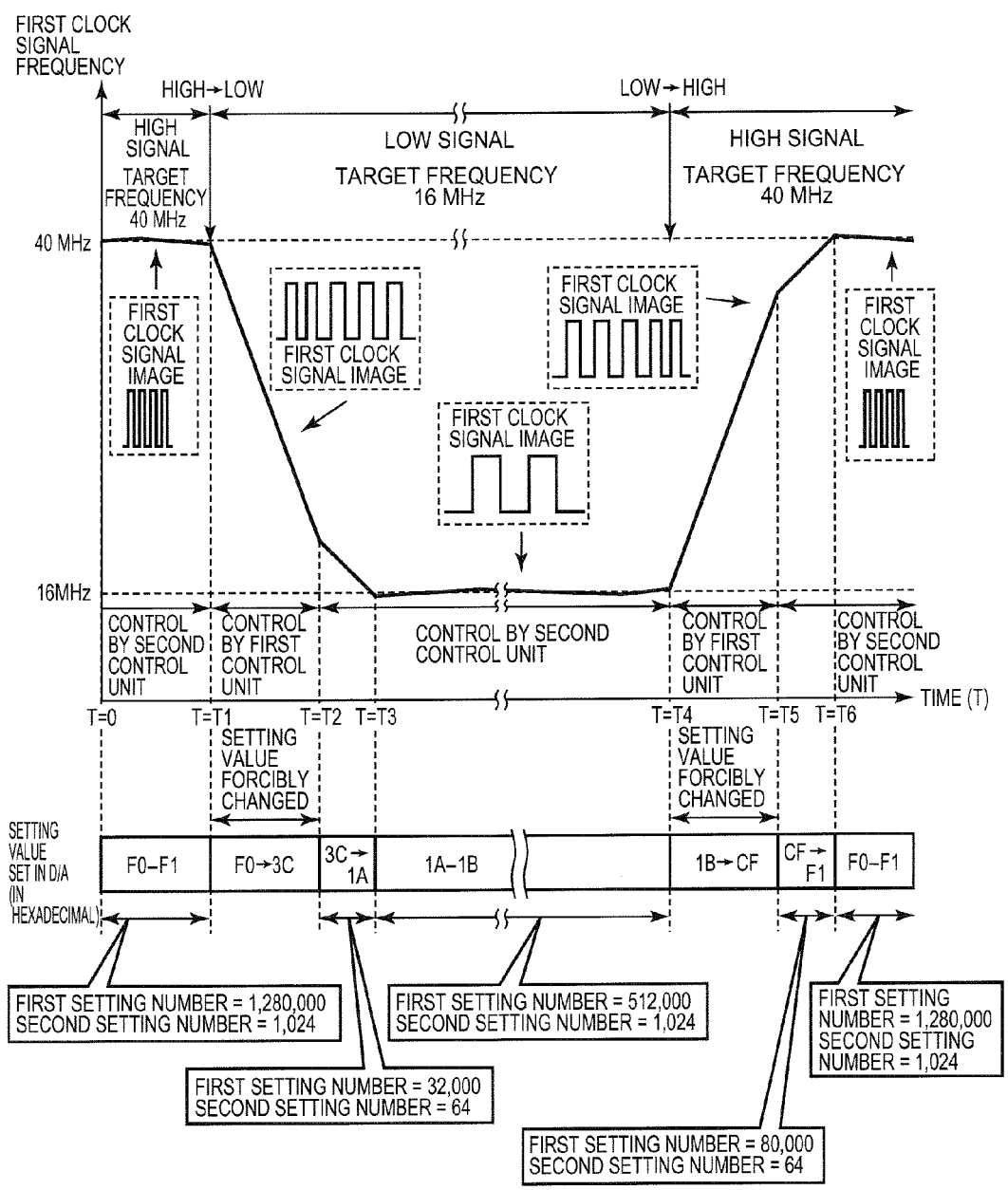
FIG. 14 is a drawing explaining the process accomplished by the clock signal generating device according to the second embodiment of the present invention, and is a drawing explaining the frequency of the first clock signal, the contents of the first control signal, the first setting number and the second setting number, the setting value set by the D/A and the time change of the controller of the setting unit.

In FIG. 14, at timing T=0 a High signal is supplied to the first control unit 201 as the first control signal. Consequently, 40 MHz is set in the first control unit 201 as the target frequency. At T=0, sufficient time is considered to have elapsed from the changing of the target frequency to 40 MHz, and at time T=0 to T1, a value of 1,280,000 is set as the first setting value in the first counter 205 and a value of 1,024 is set as the second setting value in the second counter 207.

In this period, the second control unit 203 accomplishes the process explained with reference to FIG. 13 and operates so that the frequency of the first clock signal becomes the 40 MHz target frequency. In this period, the first setting number and second setting number with large values are set in the first counter 205 and the second counter 207, respectively as the first setting value and second setting value for when the target frequency is 40 MHz. Consequently, in this period highly accurate comparison is achieved and the frequency of the first clock signal becomes stable around 40 MHz. At this time, the setting value set in the D/A 213 moves from F0 to F1 (in hexadecimal).

Next, at the timing of T=T1, the first control signal supplied to the first control unit 201 switches from a High signal to a Low signal. By detecting this switch, the first control unit 201 detects that the set target frequency has been changed from 40 MHz to 16 MHz. Furthermore, through this switch the new target frequency of 16 MHz is set in the first control unit 201.

When the above-described change (decreasing change) is detected, the first control unit 201 controls the second control unit 203 and the setting unit 211 and control of the setting unit 203 is started in place of the second control unit 203. When the first control unit 201 controls the setting unit 211 in place of the second control unit 203, the second control unit 203 may operate or at least a portion may enter standby or at least a portion may not operate. For example, the first control unit 201 controls the second control unit 203 and at least a portion of the second control unit 203 waits or at least a portion of the operation is halted. When the first control unit 201 controls the setting unit 211, at least a portion of the second control unit waits or does not operate, and through this power consumption by the clock signal generating device 200 decreases.

When a decreasing change is detected, the first control unit 201 supplies a control signal indicating instructions to lower the setting value to the setting unit 211 a predetermined number of times (here, 180 times) or for a predetermined interval. Each time this control signal is supplied, the setting unit 211 lowers the setting value set in the D/A 213 by 1. When the setting value when the decreasing change is detected is F0, the setting value is lowered one by one from F0 (in hexadecimal) to 3C (in hexadecimal). Through this, the impressed voltage impressed on the clock signal generating unit 215 is successively lowered and the frequency of the first clock signal successively generated by the clock signal generating unit 215 is gradually lowered. In this manner, when a decreasing change is detected the first control unit 201 forcibly lowers the setting value and continues to lower the impressed voltage during a predetermined interval.

The number of times the control signal indicating instructions to lower the setting value is supplied to the setting unit 211 is the number of times such that the frequency of the first clock signal continuing to be lowered does not drop below the target frequency or the number of times such that the frequency of the first clock signal that continues to decline is ultimately above the target frequency. In particular, the clock signal generating unit 215 is such that because there are variances in the performance of each product, even when the same voltage is impressed the frequency of the first clock signal generated may vary from product to product. Consequently, some margin is given in setting in advance the above-described number of times.

When a decreasing change is detected, the first control unit 201 controls the first selector 217 and the second selector 227 and changes the first setting number and the second setting number. Here, the first control unit 201 controls the first selector 217 and the second selector 227 and sets 32,000 in the first counter 205 as the first setting number and sets 64 in the second counter 207 as the second setting value. The first control unit 201 may accomplish this process at the time (T=T2) when the first control unit 201 is in the middle of or has finished lowering the impressed voltage a predetermined number of times.

When the first control unit 201 lowers the impressed voltage a predetermined number of times (at this time, let T=T2), following this the first control unit 201 halts control of the setting unit 211, controls the second control unit 203 and restarts control of the setting unit 211 by the second control unit 203. Through this, the second control unit 203 accomplishes control of the setting unit 211 and the comparison explained with reference to FIG. 13. When at least a part of the second control unit 203 is waiting or is not operating, the first control unit 201 controls the second control unit 203 and causes the second control unit 203 to operate. As described above, the first setting value set at this time is 32.000 and the second setting value is 64. The first counter 205 and the second counter 207 count pulses this number of times. These numbers are numerals smaller than the setting number set next (1/16 the number) and the accuracy of comparison is inferior, but because the count is quickly finished, the second control unit 203 can quickly accomplish control of one comparison and the setting unit 211.

At the time T=T2, the frequency of the first clock signal has not reached the target frequency. Consequently, counting by the first counter 205 finishes fasters than counting by the second counter 207 (the period T2-T3) until the frequency of the first clock signal reaches the target frequency. Consequently, until the frequency of the first clock signal reaches the target frequency, the second control unit 203 successively supplies instructions to lower the setting value to the setting unit 211 and the setting value set in the D/A 213 is lowered one by one. Here, the setting value is reduced one by one from 3C (in hexadecimal) to 1A (in hexadecimal).

When the frequency of the first clock signal reaches the target frequency (when this becomes lower than the target frequency) (T=T3), the first control unit 201 controls the first selector 217 and the second selector 227 and changes the first setting number and the second setting number. The first control unit 201 sets 512,000 in the first counter 205 as the first setting number and sets 1,024 in the second counter 207 as the second setting number. The second control signal is supplied to the first control unit 201 from the second control unit 203. When the second control signal supplied to the first control unit 201 from the second control unit 203 changes from a signal indicating instructions to lower the setting value to a signal indicating instructions to raise the setting value (in other words, when the frequency of the first clock signal has dropped below the target frequency), or when the second control signal supplied to the first control unit 201 from the second control unit 203 ceases to be supplied (in other words, when the frequency of the first clock signal has become the target frequency), the first control unit 201 determines that the frequency of the first clock signal has reached the target frequency and changes the first setting number and the second setting number.

Figure 13:
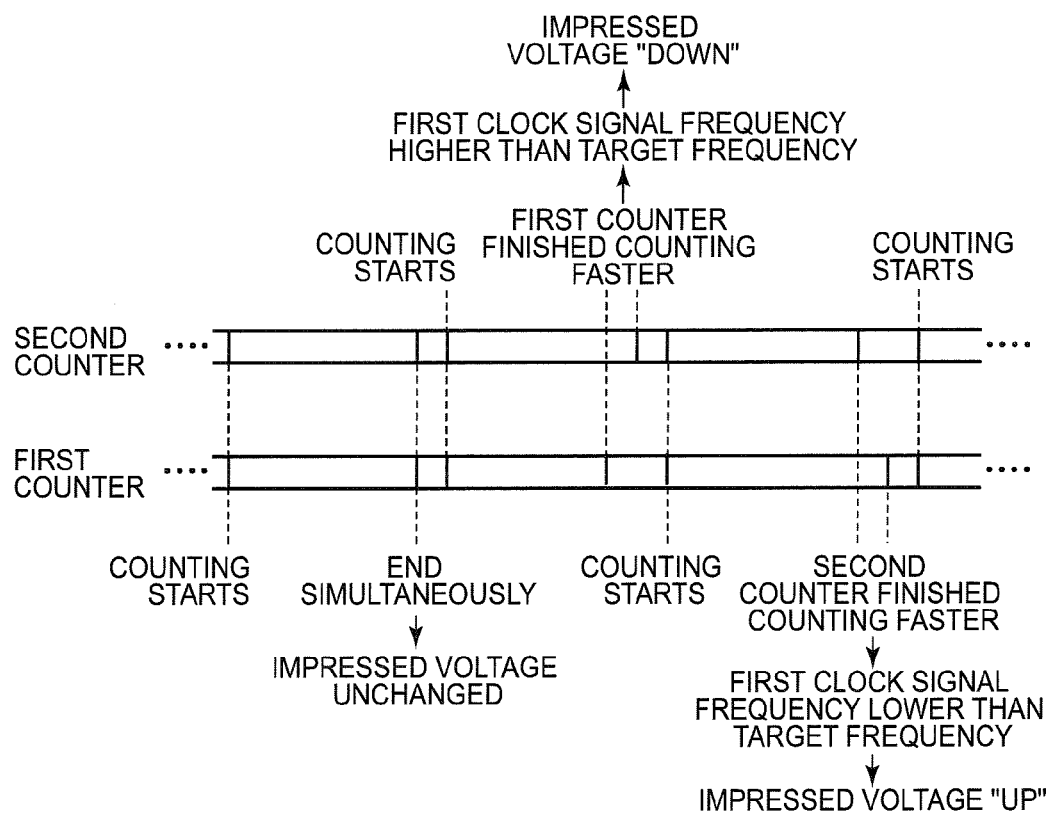
FIG. 13 is a drawing explaining the process accomplished by the second control unit of the clock signal generating device according to the second embodiment of the present invention.

After T=T3, control of the setting unit 211 and comparison as explained with reference to FIG. 13 is continued by the second control unit 203. In addition, after T=T3, the first setting number is changed to 512,000 and the second setting number is changed to 1,024 by the first control unit 201, and consequently, the number of pulses counted by the first counter 205 and the second counter 207 increases. As a result, after T=T3 very accurate comparison is accomplished in the second control unit 203. Furthermore, during this period the frequency of the first clock signal stabilizes around 16 MHz. At this time, the setting value set in the D/A 213 has some errors and changes from 1A to 1B (in hexadecimal).

Following this, at T=T4, the first control signal supplied to the first control unit 201 switches from a Low signal to a High signal. By detecting this switch, the first control unit 201 detects that the set target frequency has been changed from 16 MHz to 40 MHz. Furthermore, through this switch the new target frequency of 40 MHz is set in the first control unit 201.

When the above-described change (increasing change) is detected, the first control unit 201 controls the second control unit 203 and the setting unit 211 and control of the setting unit 203 is started in place of the second control unit 203. The method of this process is the same as when the above-described decreasing change is detected.

When an increasing change is detected, the first control unit 201 supplies a control signal indicating instructions to raise the setting value to the setting unit 211 a predetermined number of times (here, 180 times) or for a predetermined interval. Each time this control signal is supplied, the setting unit 211 raises the setting value set in the D/A 213 by 1. When the setting value when the increasing change is detected is 1B, the setting value is raised one by one from 1B (in hexadecimal) to CF (in hexadecimal). Through this, the impressed voltage impressed on the clock signal generating unit 215 is successively raised and the frequency of the first clock signal successively generated by the clock signal generating unit 215 is gradually raised. In this manner, when an increasing change is detected the first control unit 201 forcibly raises the setting value and continues to raise the impressed voltage during a predetermined interval.

The number of times the control signal indicating instructions to raise the setting value is supplied to the setting unit 211 is the number of times such that the frequency of the first clock signal continuing to be raised does not drop below the target frequency or the number of times such that the frequency of the first clock signal that continues to climb is ultimately below the target frequency. In particular, the same as in the case of increasing change, some margin is given in setting in advance the above-described number of times.

When an increasing change is detected, the first control unit 201 controls the first selector 217 and the second selector 227 and changes the first setting number and the second setting number. Here, the first control unit 201 controls the first selector 217 and the second selector 227 and sets 80,000 in the first counter 205 as the first setting number and sets 64 in the second counter 207 as the second setting value. The first control unit 201 may accomplish this process at the time (T=T5) when the first control unit 201 is in the middle of or has finished raising the impressed voltage a predetermined number of times.

When the first control unit 201 raises the impressed voltage a predetermined number of times (at this time, let T=T5), following this the first control unit 201 halts control of the setting unit 211, controls the second control unit 203 and causes control of the setting unit 211 by the second control unit 203. This is also the same as the control at T=T2. The first setting number (80,000) and the second setting number (64) set here are numerals smaller than the setting number set next (1/16 the number) and the accuracy of comparison is inferior, but because the count is quickly finished, the second control unit 203 can quickly accomplish control of one comparison and the setting unit 211.

At the time T=T5, the frequency of the first clock signal has not reached the target frequency. Consequently, counting by the second counter 207 finishes faster than counting by the first counter 205 (the period T5-T6) until the frequency of the first clock signal reaches the target frequency. Consequently, until the frequency of the first clock signal reaches the target frequency, the second control unit 203 successively supplies instructions to raise the setting value to the setting unit 211 and the setting value set in the D/A 213 is raised one by one. Here, the setting value is raised one by one from CF (in hexadecimal) to F1 (in hexadecimal).

When the frequency of the first clock signal reaches the target frequency (when this becomes higher than the target frequency) (T=T6), the first control unit 201 controls the first selector 217 and the second selector 227 and changes the first setting number and the second setting number. The first control unit 201 sets 1,280,000 in the first counter 205 as the first setting number and sets 1,024 in the second counter 207 as the second setting number. The second control signal is supplied to the first control unit 201 from the second control unit 203. When the second control signal supplied to the first control unit 201 from the second control unit 203 changes from a signal indicating instructions to raise the setting value to a signal indicating instructions to lower the setting value (in other words, when the frequency of the first clock signal has risen above the target frequency), or when the second control signal supplied to the first control unit 201 from the second control unit 203 ceases to be supplied (in other words, when the frequency of the first clock signal has become the target frequency), the first control unit 201 determines that the frequency of the first clock signal has reached the target frequency and changes the first setting number and the second setting number.

After T=T6, control of the setting unit 211 and comparison as explained with reference to FIG. 13 are continued by the second control unit 203. In addition, after T=T6, the first setting number is changed to 1,280,000 and the second setting number is changed to 1,024 by the first control unit 201, and consequently, the number of pulses counted by the first counter 205 and the second counter 207 increases. As a result, after T=T6 very accurate comparison is accomplished in the second control unit 203. Furthermore, during this period the frequency of the first clock signal stabilizes around 40 MHz. At this time, the setting value set in the D/A 213 changes from F0 to F1 (in hexadecimal).

Given the above, one example of the operation of the clock signal generating device 200 will be further explained. The operation of each part below appropriately ends when the power source is turned off. In addition, when the clock signal generating device 200 begins to operate, the setting unit 211 for example as the initial operation first sets a predetermined setting value set in advance so that the frequency of the first clock signal becomes around 40 MHz (for example F0 (in hexadecimal)) in the D/A 213. Through this, the clock signal generating unit 215 generates a first clock signal having a frequency near 40 MHz after operations start.

Figure 15:
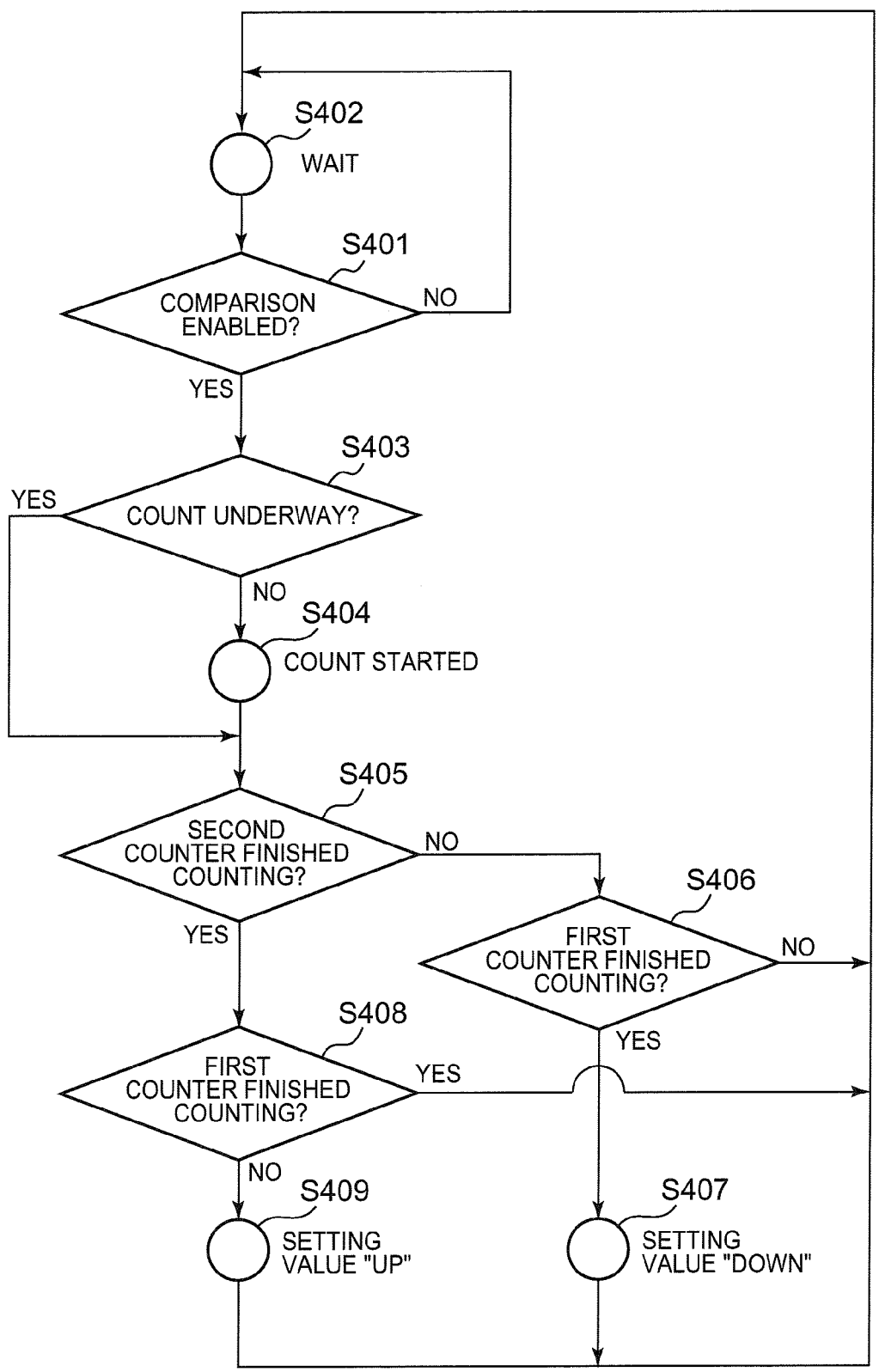
FIG. 15 shows the operation flow accomplished by the second control unit of the clock signal generating device according to the second embodiment of the present invention.

First, operation of the second control unit 203 will be further explained with reference to FIG. 15. In addition, the below-described operation starts from step S402, for example, when the clock signal generating device 200 begins to operate.

The second control unit 203 makes a determination regarding enabling comparisons (step S401). For example, if "1" is set as the setting value related to this comparison (hereafter called the comparison setting value) in the second control unit 203, the determination here is YES (step S401; YES). For example, if "0" is set as the comparison setting value in the second control unit 203, the determination here is NO (step S401; NO).

When the first control unit 201 detects a change in the target frequency (see above), the first control unit 201 sets "0" as the comparison setting value in the second control unit 203 and causes the second control unit 203 to wait. Through this, the first control unit 201 controls the second control unit 203 and accomplishes control of the impressed voltage in place of the second control unit 203. In the second control unit 203, normally "1" is set as the comparison setting value and the second control unit 203 controls the setting unit 211.

When NO is the determination in the process of step S401 (step S401; NO), the second control unit 203 waits until the next pulse of the second clock signal is supplied to the second control unit 203 (step S402) and, when the next pulse is supplied, again accomplishes the process of step S401. Until the next pulse is supplied means, for example, until the rising edge of the next pulse (the same hereafter regarding supplying of pulses of the second clock signal). By repeating the process of NO in step S401 and the process of step S402, the second control unit 203 waits as long as "0" is set as the comparison setting value (until "1" is set). When NO is determined in the process of step S401, the second control unit 203 halts counting when at least one of the first counter 205 and the second counter 207 is counting.

When the determination is YES in the process of step S401 (step S401; YES), the second control unit 203 determines whether or not the first counter 205 and the second counter 207 are counting (for example, doing clock division) (step S403). In addition to controlling the first counter 205 and the second counter 207, the second control unit 203 compares the finish of counting, so this unit can determine whether or not the first counter 205 or the second counter 207 is counting. If notification of the end of counting has not been given, counting is underway.

When the determination is that neither the first counter 205 nor the second counter 207 is counting (step S403; NO), the second control unit 203 controls the first counter 205 and the second counter 207 with the timing of the next pulse of the second clock signal being supplied, and simultaneous with causing the first counter 205 to begin counting the pulses of the first clock signal up to the first setting number, causes the second counter 207 to begin counting the pulses of the second clock signal up to the second setting number (step S404) and then accomplishes the process of step S405.

When it is determined that the first counter 205 or the second counter 207 is counting (step S403; YES), the second control unit 203 accomplishes the process of step S405.

In the process of step S405, the second control unit 203 determines whether or not counting by the second counter 207 has ended. For example, the second control unit 203 determines that counting has ended if notification of counting ending has been received from the second counter 207 (step S405; YES) and determines that counting has not ended if notification of counting ending has not been received (step S405; NO).

When it is determined that the second counter 207 has not finished counting (step S405; NO), the second control unit 203 determines whether or not counting by the first counter 205 has ended (step S406). For example, the second control unit 203 determines that counting has ended if notification of counting ending has been received from the first counter 205 (step S406; YES) and determines that counting has not ended if notification of counting ending has not been received (step S406; NO).

When the determination is that counting by the first counter 205 has not ended (step S406; NO), the second control unit 203 returns to the process of step S402. When it is determined that counting by the first counter 205 has not ended, this means that neither counting by the first counter 205 nor the second counter 207 has been finished after the start of counting by the first counter 205 and the second counter 207 (step S404). Consequently, the second control unit 203 repeats the processes of step S402, step S401, the YES process of step S403, the NO process of step S405 and the NO process of step S406 until counting by at least one out of the first counter 205 and the second counter 207 finishes after the start of counting or until the comparison setting value is changed.

On the other hand, when the determination is that counting by the first counter 205 has finished (step S406; YES), the second control unit 203 supplies a second control signal indicating instructions to lower the setting value to the setting unit 211 with the timing with which the next pulse of the second clock signal is supplied, so that the setting value set in the D/A 213 is lowered by 1 (step S407). Through this, the impressed voltage is lowered. When counting by the second counter 207 is not finished (step S405; NO) but counting by the first counter 205 is finished (step S406; YES), that means that counting the number of pulses of the first clock signal up to the first setting number has ended faster than counting the number of pulses of the second clock signal up to the second setting number. In this case, the frequency of the first clock signal is higher than the target frequency. Consequently, the second control unit 203 lowers the impressed voltage in order to lower the frequency of the first clock signal.

In addition, when it is determined that counting by the second counter 207 has ended (step S405; YES), the second control unit 203 determines whether or not counting by the first counter 205 has ended (step S408). Details of this process are the same as the process of step S406.

When it is determined that counting by the first counter 205 has ended (step S408; YES), the second control unit 203 accomplishes the process of step S402. If counting by the second counter 207 has ended (step S405; YES) and counting by the first counter 205 has ended (step S408), this means that counting by the first counter 205 and counting by the second counter 207 have ended simultaneously. In this case, the frequency of the clock signal matches the target frequency, so the second control unit 203 does not change the impressed voltage, so the processes of step S403, step S404 and step S405 are accomplished as long as the comparison setting value remains unchanged, counting is restarted and the target frequency and the frequency of the first clock signal are again compared (comparing the ending of counting).

On the other hand, when it is determined that counting by the first counter 205 has not ended (step S408; NO), the second control unit 203 supplies a second control signal indicating instructions to raise the setting value to the setting unit 211 with the timing with which the next pulse of the second clock signal is supplied from the standard signal generating unit 230 to the second control unit 203, so that the setting value set in the D/A 213 is raised by 1. Through this, the impressed voltage is raised. When counting by the second counter 207 has ended (step S405; YES) but counting by the first counter 205 has not ended (step S408; NO), this means that counting by the second counter 207 has ended faster. In this case, as discussed above, the frequency of the first clock signal is lower than the target frequency. Consequently, the second control unit 203 raises the impressed voltage in order to raise the frequency of the first clock signal In this manner, when "1" is set as the comparison setting value, the second control unit 203 successively compares the target frequency and the frequency of the first clock signal and controls the impressed voltage in accordance with the comparison results. Through this, the frequency of the first clock signal successively generated is adjusted to become the target frequency. In the above description, the first counter 205 and the second counter 207 accomplish counting with the first setting number and the second setting number set in the first counter 205 and the second counter 207, respectively, at that time.

Figure 16:
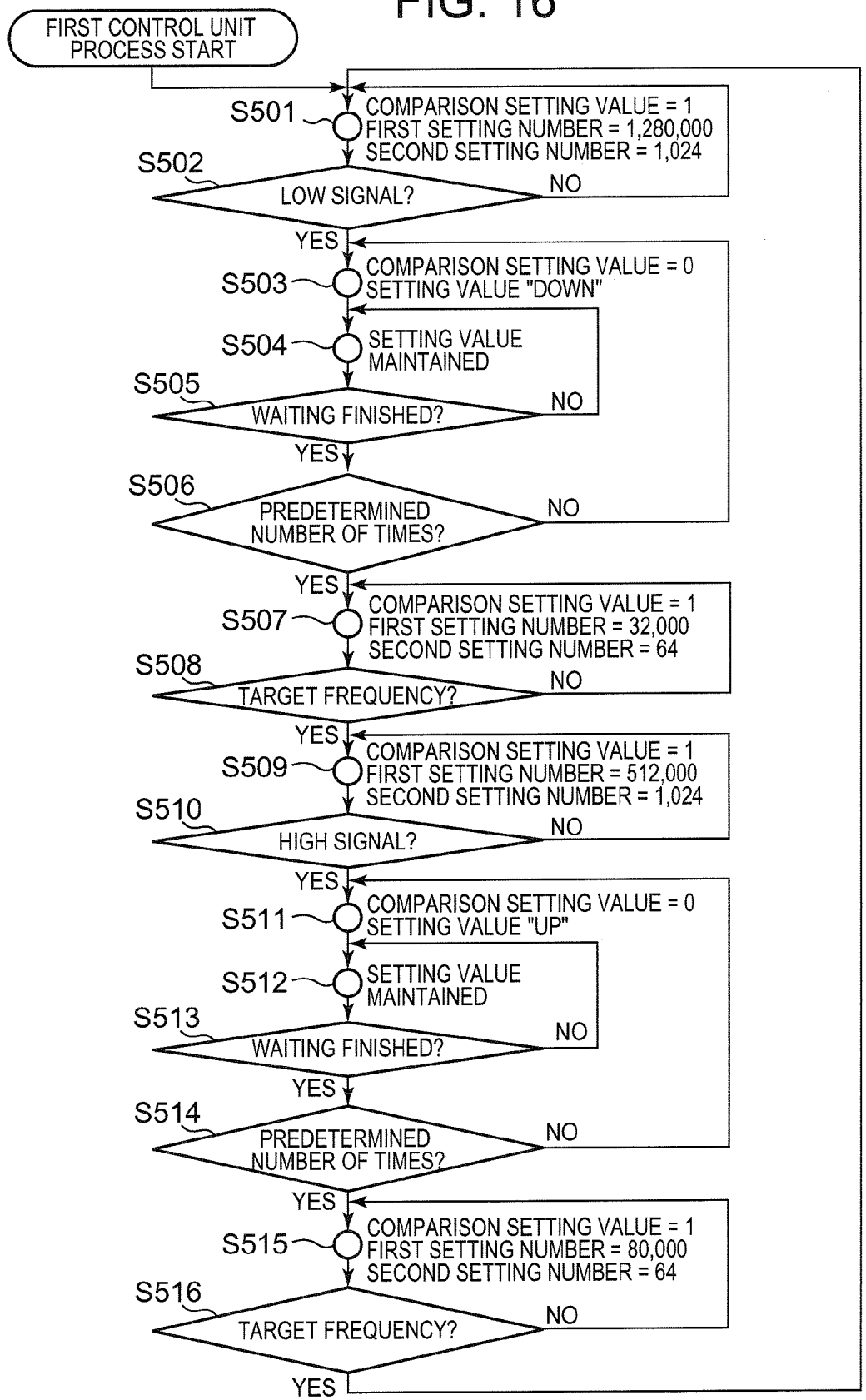
FIG. 16 shows the operation flow accomplished by the first control unit of the clock signal generating device according to the second embodiment of the present invention.

Next, the operations of the first control unit 201 will be explained with reference to FIG. 16. The first control unit 201 starts the below process when the clock signal generating device 200 begins to operate. The first control unit 201 starts the process from step S501.

The first control unit 201 sets "1" as the comparison setting value in the setting unit 211 and the second control unit 213, controls the first selector 217 and the second selector 227, sets 1,280,000 as the first setting number in the first counter 205 and seconds 1,024 as the second setting number in the second counter 207, with the timing with which the next pulse of the second clock signal is supplied (step S501). When the above-described numbers have already been set, the first control unit 201 does nothing to the numbers already set.

Next, the first control unit 201 determines whether the first control signal supplied from outside is a Low signal (step S502). If this is not a Low signal (step S502; NO), the first control unit 201 again accomplishes the process of step S501. Through this, the first control unit 201 waits until the first control signal is a Low signal. During this wait, the second control unit 203 and the setting unit 211 operate so that the frequency of the first clock signal becomes the target frequency of 40 MHz.

When the first control signal is a Low signal (step S502; YES), the first control unit 201 has detected a decreasing change in the target frequency. In this case, the first control unit 201 sets "0" as the comparison setting value in the setting unit 211 and the second control unit 203 (or in the case when this is already set, does nothing), and supplies a control signal indicating instructions to lower the setting value to the setting unit 211, with the timing with which the next pulse of the second clock signal is supplied (step S503). Through this, the first control unit 201 controls the setting unit 211 in place of the second control unit 203 and outputs an instruction to lower the setting value to the setting unit 211.

After the process of step S503, the first control unit 201 waits until the timing with which the next pulse of the second clock signal is supplied (step S504) and then accomplishes the process of step S505. At this time, the setting value is stored by the D/A 213 without changing.

In step S505, the first control unit 201 determines whether or not waiting has ended. The first control unit 201 determines that waiting has ended for example when the process of step S504 has been repeated a preset number of times (step S505; YES). The first control unit determines that waiting has not ended for example when the repeating of the process of step S505 is less than the aforementioned number of times (step S505; NO).

When it is determined that waiting has not ended (step S505; NO), the first control unit 201 again accomplishes the process of step S504. In this manner, the first control unit 201 waits until a predetermined number of pulses of the second clock signal are supplied. Through this waiting, it is possible to adequately obtain a time interval for lowering the frequency of the first clock signal, making it possible to prevent or mitigate cases where the change in the frequency is too fast and operation of the supply destinations of the first clock signal cannot keep pace with the change in the frequency of the first clock signal, when the frequency of the first clock signal successively changes. If the operation of the supply destinations can cope with this change in frequency even when the frequency of the first clock signal is successively lowered each pulse of the second clock signal, the processes of step S504 and step S505 may be omitted. In this case, it is possible for the frequency of the first clock signal to approach the target frequency quickly.

When it is determined that waiting has ended (step S505; YES), the first control unit 201 determines whether a control signal indicating instructions to lower the setting value has been supplied a predetermined number of times set in advance (180 times in the case of FIG. 14) (step S506). The first control unit 201 accomplishes this determination by counting the number of times the aforementioned control signal is supplied. The predetermined number of times may also be expressed by a time interval. Because supplying of the aforementioned control signal is accomplished at a set interval, the first control unit 201 makes the determination that the supplying of the aforementioned control signal has been accomplished the predetermined number of times only when the time from when the YES determination was made in the process of step S502 is tabulated, and a predetermined time interval (for example, the interval to accomplish supplying of the aforementioned control signal 180 times, which is set in advance) has elapsed (step S506; YES).

When it is determined that supplying of the aforementioned control signal has not been accomplished the predetermined number of times (step S506; NO), the first control unit 201 again accomplishes the process of step S503. In this manner, the first control unit 201 continues to lower the setting value and continues to lower the impressed voltage during a predetermined time interval and a predetermined number of times (a predetermined period).

When it is determined that supplying of the aforementioned control signal has been accomplished the predetermined number of times (step S506; YES), the first control unit 201 sets "1" as the comparison setting value in the setting unit 211 and the second control unit 213 and also controls the first selector 217 and the second selector 227, sets 32,000 as the first setting number in the first counter 205 and sets 64 as the second setting number in the second counter 207, with the timing with which the next pulse of the second clock signal is supplied (step S507). When the aforementioned numbers have already been set, the first control unit 201 does nothing to these numbers.

Next, the first control unit 201 determines whether the frequency of the first clock signal has reached the target frequency (step S508). This determination is accomplished based on the second control signal supplied to the first control unit 201 from the second control unit 203, the same as above. The first control unit 201 determines that the frequency of the first clock signal has reached the target frequency when the second control signal changes from a signal indicating instructions to lower the setting value to a signal indicating instructions to raise the setting value, or when the second control signal is not supplied (step S508; YES), and determines that the target frequency has not been reached if the second control signal does not change the instruction to lower the setting value (step S508; NO).

When it is determined that the frequency of the first clock signal has not reached the target frequency (step S508; NO), the first control unit 201 again accomplishes the process of step S507. In this manner, the control unit 201 waits until the frequency of the first clock signal reaches the target frequency.

When it is determined that the frequency of the first clock signal has reached the target frequency (step S508; YES), the first control unit 201 again accomplishes the process of step S507. With the timing with which the next pulse of the second clock signal is supplied, "1" is set as the comparison setting value in the setting unit 211 and the second control unit 213, 512,000 is set as the first setting number in the first counter 205 and 1,024 is set as the second setting number in the second counter 207 (step S509). When the aforementioned numbers have already been set, the first control unit 201 does nothing to these numbers.

Next, the first control unit 201 determines whether the first control signal supplied from outside is a High signal (step S509). If this is not a High signal (step S510; NO), the first control unit 201 again accomplishes the process of step S509. Through this, the first control unit 201 waits until the first control signal is a High signal. During this wait, the second control unit 203 and the setting unit 211 operate so that the frequency of the first clock signal becomes the target frequency of 16 MHz.

When the first control signal is a High signal (step S510; YES), the first control unit 201 has detected an increasing change in the target frequency. In this case, the first control unit 201 sets "1" as the comparison setting value in the setting unit 211 and the second control unit 203 (or in the case when this is already set, does nothing), and supplies a control signal indicating instructions to raise the setting value to the setting unit 211, with the timing with which the next pulse of the second clock signal is supplied (step S511). Through this, the first control unit 201 controls the setting unit 211 in place of the second control unit 203 and outputs an instruction to raise the setting value to the setting unit 211.

After the process of step S511, the first control unit 201 waits until the timing with which the next pulse of the second clock signal is supplied (step S512) and then accomplishes the process of step S513. At this time, the setting value is stored by the D/A 213 without changing.

In step S513, the first control unit 201 determines whether or not waiting has ended. The first control unit 201 determines that waiting has ended for example when the process of step S512 has been repeated a preset number of times (step S513; YES). The first control unit determines that waiting has not ended for example when the repeating of the process of step S512 is less than the aforementioned number of times (step S513; NO).

When it is determined that waiting has not ended (step S513; NO), the first control unit 201 again accomplishes the process of step S504. In this manner, the first control unit 201 waits until a predetermined number of pulses of the second clock signal are supplied. Through this waiting, it is possible to adequately obtain a time interval for lowering the frequency of the first clock signal, making it possible to prevent or mitigate cases where the change in the frequency is too fast and operation of the supply destinations of the first clock signal cannot keep pace with the change in the frequency of the first clock signal, when the frequency of the first clock signal successively changes. If the operation of the supply destinations can cope with this change in frequency even when the frequency of the first clock signal is successively raised each pulse of the second clock signal, the processes of step S512 and step S513 may be omitted. In this case, it is possible for the frequency of the first clock signal to approach the target frequency quickly.

When it is determined that waiting has ended (step S513; YES), the first control unit 201 determines whether a control signal indicating instructions to lower the setting value has been supplied a predetermined number of times set in advance (180 times in the case of FIG. 14) (step S506). The first control unit 201 accomplishes this determination by counting the number of times the aforementioned control signal is supplied. The predetermined number of times may also be expressed by a time interval. Because supplying of the aforementioned control signal is accomplished at a set interval, the first control unit 201 makes the determination that the supplying of the aforementioned control signal has been accomplished the predetermined number of times only when the time from when the YES determination was made in the process of step S510 is tabulated, and a predetermined time interval (for example, the interval to accomplish supplying of the aforementioned control signal 180 times, which is set in advance) has elapsed (step S513; YES).

When it is determined that supplying of the aforementioned control signal has not been accomplished the predetermined number of times (step S513; NO), the first control unit 201 again accomplishes the process of step S511. In this manner, the first control unit 201 continues to raise the setting value and continues to raise the impressed voltage during a predetermined time interval and a predetermined number of times (a predetermined period).

When it is determined that supplying of the aforementioned control signal has been accomplished the predetermined number of times (step S514; YES), the first control unit 201 sets "1" as the comparison setting value in the setting unit 211 and the second control unit 213 and also controls the first selector 217 and the second selector 227, sets 80,000 as the first setting number in the first counter 205 and sets 64 as the second setting number in the second counter 207, with the timing with which the next pulse of the second clock signal is supplied (step S515). When the aforementioned numbers have already been set, the first control unit 201 does nothing to these numbers.

Next, the first control unit 201 determines whether the frequency of the first clock signal has reached the target frequency (step S516). This determination is accomplished based on the second control signal supplied to the first control unit 201 from the second control unit 203, the same as above. The first control unit 201 determines that the frequency of the first clock signal has reached the target frequency when the second control signal changes from a signal indicating instructions to raise the setting value to a signal indicating instructions to lower the setting value, or when the second control signal is not supplied (step S508; YES), and determines that the target frequency has not been reached if the second control signal does not change the instruction to raise the setting value (step S508; NO).

When it is determined that the frequency of the first clock signal has not reached the target frequency (step S516; NO), the first control unit 201 again accomplishes the process of step S515. In this manner, the control unit 201 waits until the frequency of the first clock signal reaches the target frequency.

When it is determined that the frequency of the first clock signal has reached the target frequency (step S508; YES), the first control unit 201 again accomplishes the process of step S501.

Through this kind of operation, when a change in the target frequency is detected the first control unit 201 first controls the setting unit 211 in place of the second control unit 203 and continues to forcibly change the impressed voltage a predetermined number of times in a predetermined interval and causes the frequency of the first clock signal to approach the target frequency (refer appropriately to FIG. 14). Through this, the frequency of the first clock signal approaches the target frequency without counting of the pulses being accomplished, making it possible for the frequency of the first clock signal to quickly approach the target frequency.

In addition, following this accuracy drops by the first control unit 201 first setting the first setting number and the second setting number to small values, but a comparison that quickly finishes counting is accomplished by the second control unit 203 and it is possible for the frequency of the first clock signal to quickly reach the target frequency. Furthermore, following this the first control unit 201 sets the first setting number and the second setting number to large values, and through this time is required but a very accurate comparison is accomplished by the second control unit 203 so the frequency of the first clock signal reaches the target frequency with very good accuracy.

Figure 17:
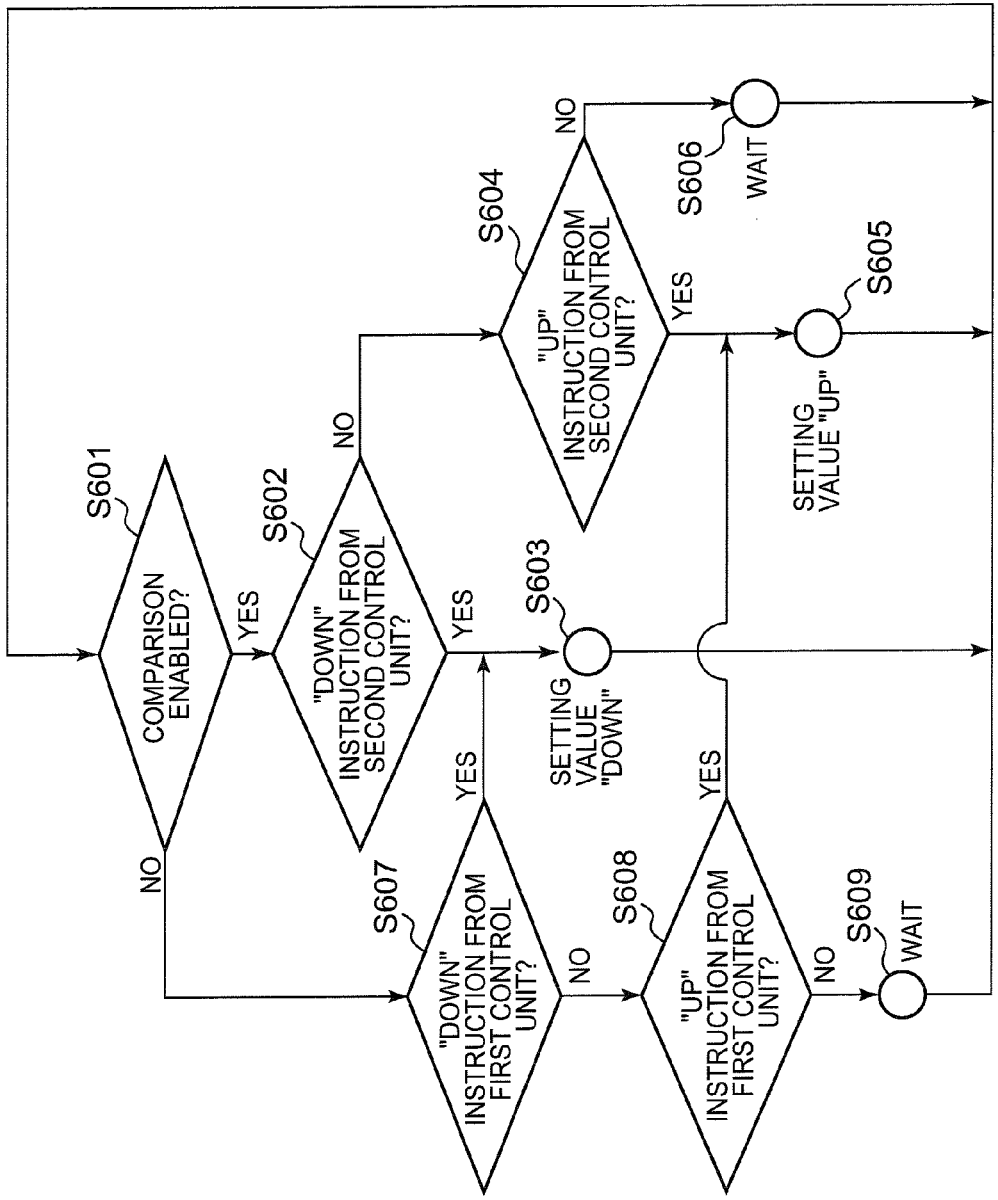
FIG. 17 shows the operation flow accomplished by the setting unit of the clock signal generating device according to the second embodiment of the present invention.

Next, the operation of the setting unit 211 is explained with reference to FIG. 17. When the clock signal generating device 200 begins operating, the setting unit 211 begins the below-described operation. As discussed above, a standard signal is supplied from the standard signal generating unit 230 to the first control unit 201. In addition, the setting unit 211 begins the operation from step S601, for example, after the clock signal generating device 200 has begun operating and the aforementioned initial value is set in the D/A 213.

The setting unit 211 makes a determination regarding comparison enabling (step S601). For example, if "1" is set as the comparison setting value in the setting unit 211, the determination here is YES (step S601; YES). For example, if "0" is set as the comparison setting value in the setting unit 211, the determination here is NO (step S601; NO)

When the determination is that comparison enabling is YES (step S601; YES), in other words when "1" has been set as the comparison setting value, the setting unit 211 is controlled by the second control unit 203. Furthermore, in this case a determination is made as to whether a second control signal indicating instructions to lower the control value has been supplied from the second control unit 203 (step S602).

When the aforementioned second control signal has been supplied (step S602; YES), the setting unit 211 accomplishes the process of step S603.

In the process of step S603, the setting unit 211 lowers the setting value set in the D/A 213 by 1 with the timing with which the next pulse of the second clock signal is supplied. Through this, the impressed voltage is lowered and the frequency of the newly generated clock signal is lowered. The setting unit 211 then accomplishes the process of step S601.

When the aforementioned second control signal has not been supplied (step S602; NO), the setting unit 211 determines whether a second control signal indicating instructions to raise the control value has been supplied from the second control unit 203 (step S604).

When the aforementioned second control signal has been supplied (step S604; YES), the setting unit accomplishes the process of step S605.

In the process of step S605, the setting unit 211 raises the setting value set in the D/A 213 by 1 with the timing with which the next pulse of the second clock signal is supplied. Through this, the impressed voltage is raised. Through this, the frequency of the newly generated clock signal is raised. The setting unit 211 then accomplishes the process of step S601.

When the aforementioned second control signal has not been supplied (step S604; NO), the setting unit 211 accomplishes the process of step S606. At this time, the second control signal has not been supplied from the second control unit 203

In the process of step S606, the setting unit 211 waits until the next pulse of the second clock signal is supplied to the setting unit 211 and when the next pulse is supplied again accomplishes the process of step S601.

When the determination regarding comparison enabling is NO (step S601; NO), in other word when "0" is set as the comparison setting value, the setting unit 211 is controlled by the first control unit 201. Furthermore, in this case a determination is made as to whether a control signal indicating instructions to lower the control value has been supplied from the first control unit 201 (step S607).

When the aforementioned control signal has been supplied (step S607; YES), the setting unit 211 accomplishes the process of step S603.

When the aforementioned control signal has not been supplied (step S607; NO), the setting unit 211 determines whether a control signal indicating instructions to raise the control value has been supplied from the first control unit 201 (step S608).

When the aforementioned control signal has been supplied (step S608; YES), the setting unit 211 accomplishes the process of step S605.

When the aforementioned control signal has not been supplied (step S607; NO), the setting unit 211 accomplishes the process of step S609. At this time, an instruction to change the control value has not been received from the first control unit 201.

In the process of step S609, the setting unit waits until the next pulse of the standard signal is supplied to the setting unit 211, and when the next pulse is supplied again accomplishes the process of step S601.

In this manner, the setting unit 211 is controlled by the second control unit 203 and the first control unit 201, the setting value set in the D/A 213 is maintained or raised or lowered, and impressed voltage is maintained or raised or lowered and the frequency of the first clock signal is maintained or raised or lowered.

In the present embodiment, with the above structure the second control unit 203 causes the counting of pulse numbers by the first counter 205 and the second counter 207 to start simultaneously, compares the timing of counting up to the first setting number ending in the first counter 205 with the timing of counting up to the second setting number ending in the second counter 207, and successively accomplishes the voltage control process that controls the voltage value of the voltage impressed on the clock signal generating unit 215 in accordance with the comparison results.

In addition, in the present embodiment, with the above structure, when the set target frequency is the first target frequency (in the present embodiment 40 MHz (or 16 MHz)) the first control unit 201 accomplishes a first setting by setting the first number (in this example, 1,280,000 (or 512,000)) as the first setting number in the first counter 205 and setting the second number (in the present embodiment, 1,024) as the second setting number in the second counter 207.

In addition, in the present embodiment, with the above structure, when the set target frequency is the second target frequency (in the present embodiment 16 MHz (or 40 MHz)) the first control unit 201 accomplishes a second setting by setting the third number (in this example, 512,000 (or 1,280,000)) as the first setting number in the first counter 205 and setting the fourth number (in the present embodiment, 1,024) as the second setting number in the second counter 207.

Furthermore, in the present embodiment, with the above structure, when the set target frequency is changed from the first target frequency to the second target frequency, the first control unit 201 sets the fifth number (in this embodiment, 32,000 (or 80,000)), which is smaller than the third number (in this embodiment, 1/16), as the first setting number in the first counter 205 and sets the sixth number (in this embodiment, 64), which is smaller than the fourth number, as the second setting number in the second counter 207, with a first predetermined timing (in this embodiment, the timing immediately after the first control unit 201 continues to periodically change the voltage value of the impressed voltage in place of the second control unit 203, as described below). Following this, the first control unit 201 accomplishes the second setting with a second predetermined timing (the timing immediately after the frequency of the first clock signal has reached the target frequency) after the first predetermined timing.

In the present embodiment, when the target frequency has been changed, the fifth number, which is smaller than the third number, and the sixth number, which is smaller than the fourth number, are respectively set in the first counter 205 and the second counter 207, so the accuracy drops but a comparison in which counting ends quickly (low-accuracy comparison) is accomplished by the second control unit 203, and it is possible for the frequency of the first clock signal to quickly approach or reach the target frequency. Consequently, even when the target frequency is changed, the frequency of the first clock signal can be made to match the post-change target frequency in a short time. In addition, with the present embodiment the voltage control process using the fifth number and the sixth number takes 1/16 the time by simple calculation compared to the voltage control process using the third number and the fourth number. In addition, after the voltage control process using the fifth number and the sixth number, the third number and the fourth number are respectively set in the first counter 205 and the second counter 207 as the first setting number and the second setting number, so the frequency of the clock signal can be made to match the target frequency with high accuracy.

In addition, with the present embodiment, through the above structure when the target frequency is changed from the first target frequency to the second target frequency, the first control unit 201 further accomplishes the process of continuing to cause the voltage value of the voltage impressed on the clock signal generating unit 215 in place of the second control unit 203 to periodically change (rising or falling) a predetermined number of times (above, 180 times) or for a predetermined interval so that the frequency of the first clock signal approaches the second target frequency, and when the first control unit finishes the above process, the second control unit successively accomplishes a voltage control process using the first counter 205 in which the fifth number is set and the second counter 207 in which the seventh number is set and successively accomplishes the voltage value of the voltage in place of the first control unit 201. Through this, with the above process accomplished by the first control unit 201 it is possible to cause the frequency of the first clock signal to match the target frequency in a shorter time because the frequency of the first clock signal approaches the target frequency without pulse counting being undertaken.

In addition, after the frequency of the first clock signal has approached the target frequency, control of the frequency of the first clock signal is done with low-accuracy comparison, so in the above process accomplished by the first control unit 201, it is possible to cause the successively changing frequency of the first clock signal to match the target frequency in a short time through low-accuracy comparison even when the time of this process is shortened, so that the successively changing frequency of the first clock signal does not go past the target frequency. Furthermore, through low-accuracy comparison, the frequency of the first clock signal deviating greatly from the target signal is eliminated.

In addition, in the present embodiment, with the above structure when it is detected that the frequency of the first clock signal, which is changing by the voltage control process being successively accomplished using first counter 205 in which the fifth number is set and the second counter 207 in which the sixth number is set, has reached the second target frequency, the third number is set in the first counter 205 and the fourth number is set in the second counter 207. Through this, it is possible to cause the frequency of the first clock signal to match the target frequency in a short time.

In addition, in the present embodiment, with the above structure the second control unit 203 accomplishes control through a control method (supplying or not supplying the second control signal, etc.) that either raises, maintains or lowers the voltage value of the voltage impressed on the clock signal generating unit 215 in accordance with the comparison results, and the first control unit detects whether the control method by the second control unit has changed (change of the content the second control signal indicates or changing from supplying to not supplying the second control signal) and through this detects that the frequency of the first clock signal has reached the second target frequency, and through this easily detects that the frequency of the first clock signal has reached the second target frequency.

In addition, as described above, the fifth number and the sixth number are preferably the third number and the fourth number, respectively, divided by a predetermined figure. Through this, the fifth number and the sixth number can be made the first setting number and the second setting number.

In addition, it is good for the second number and fourth number to be the same number, as described above. Through this, storage locations for the value of the second setting number can be reduced.

When the frequency of the first clock signal is changed, it is possible to change this most quickly when the first control unit 201 causes the impressed voltage to change a predetermined number of times in place of the second control unit 203 (hereafter, the process of this case will be referred to as Process A). This is because comparisons and pulse counting are not accomplished in Process A. Consequently, when the target frequency is changed, with Process A the frequency of the first clock signal is controlled to approach the target frequency, and following this, for example, a highly accurate comparison (for example, counting with the third number and the fourth number) may be accomplished without accomplishing a low-accuracy comparison (for example, counting with the fifth number and the sixth number).

Figure 18:
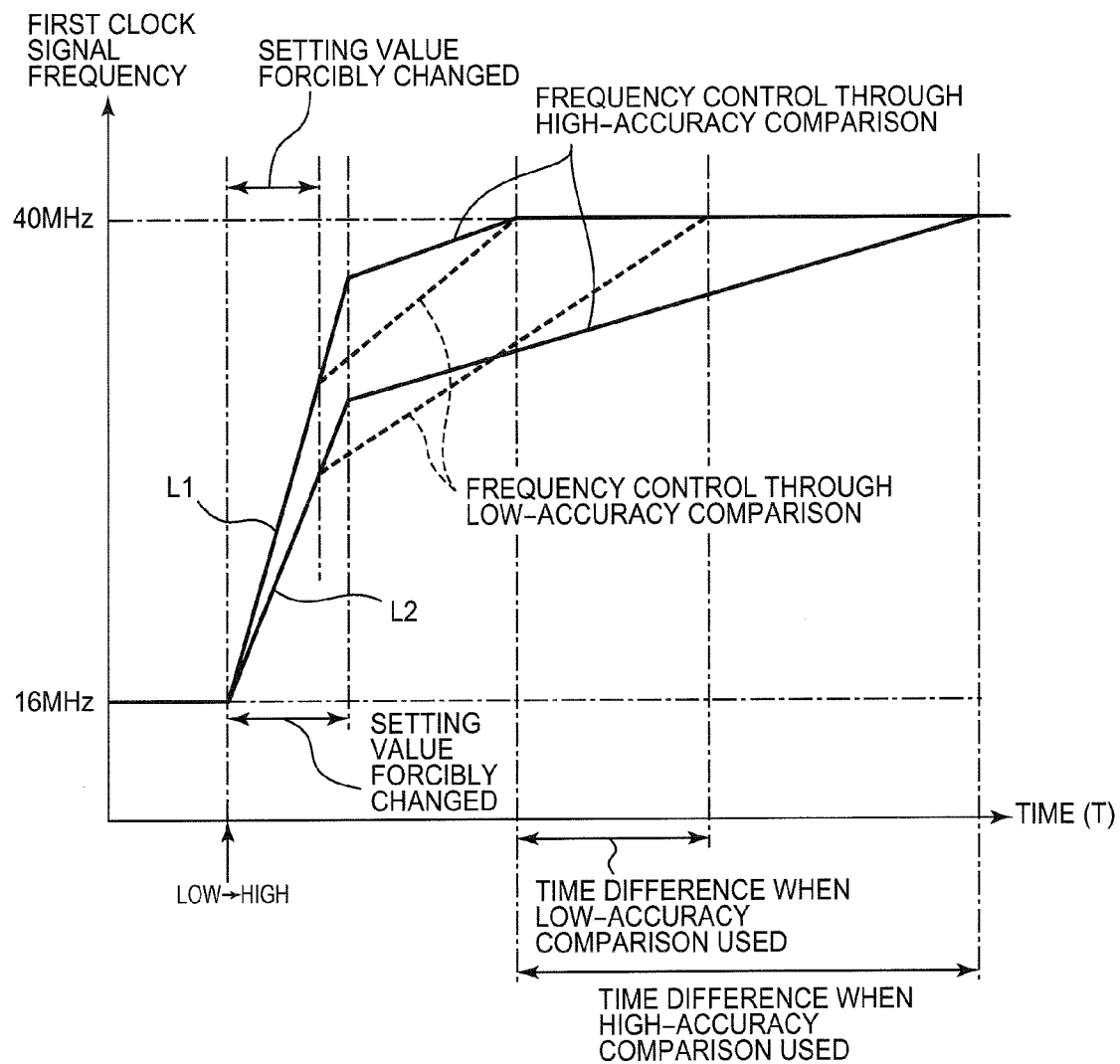
FIG. 18 shows the correlation for two clock signal generating units between the time and the change in the frequency of the first clock signal controlled by the first control unit and the second control unit in the clock signal generating device according to the second embodiment of the present invention; and, FIG. 19 shows the time change in the frequency of the first clock signal controlled by the second control unit in the clock signal generating device according to the second embodiment of the present invention.

However, there are difficulties in the above-described approach. These difficulties are explained with reference to FIG. 18. FIG. 18 shows the relationship between time and change in the frequency of the first clock signal controlled by the first control unit 201 and the second control unit 202 for two clock signal generating units 215. In FIG. 18, the graph line L1 is a line for one of the clock signal generating units 215 and the graph L2 is a line for the other clock signal generating unit 215. Here, the explanation is for the case when the target frequency changed from 16 MHz to 40 MHz, but the case when the target frequency changed from 40 MHz to 16 MHz is the same.

The voltage-frequency characteristic, which is the relationship between the impressed voltage and the frequency of the generated first clock signal in the clock signal generating unit 215, varies for each clock signal generating unit 215, in other words for each product, so there is variance. Furthermore, even if the first control unit 201 has changed the frequency of the first clock signal through Process A, it was found that the frequency of the first clock signal after Process A differs for each product. Consequently, when the frequency of the first clock signal is made to match the target frequency, the developers discovered that time differences arise. For example, as shown by the graph line L1 and the graph line L2 in FIG. 18, the frequency after Process A may differ depending on the clock signal generating unit 215. As shown by the graph line L1, in one of the clock signal generating units 215 change in the frequency of the first clock signal relative to the impressed voltage is not very sensitive, and as shown by the graph line L2, in the other clock signal generating unit 215 change in the frequency of the first clock signal relative to the impressed voltage is very sensitive.

Regarding the two clock signal generating units 215 of FIG. 18, when the frequency is controlled by accomplishing high-accuracy comparison using the second control unit 203 after Process A was accomplished for the same time, the frequencies of each change are indicated by the solid segments of the graph lines L1 and L2. In addition, regarding the two clock signal generating units 215 of FIG. 18, when the frequency is controlled by accomplishing low-accuracy comparison using the second control unit 203 after Process A was accomplished for the same time, the frequencies of each change are indicated by the dotted segments of the graph lines L1 and L2, for example.

In the case of the low-accuracy comparison, the time for Process A is short. For the graph line L2, this is because the frequency of the first clock signal is adjusted so as to reach the target frequency in roughly the same time with low-accuracy comparison or with high-accuracy comparison. In addition, the time for Process A (in other words, the predetermined number of times) is set shorter so that the successively changing frequency of the first clock signal does not pass the target frequency.

As can be understood by looking at FIG. 18, for the two clock signal generating units 215, the time difference in reaching the target frequency is smaller with low-accuracy comparison than with high-accuracy comparison. This is because low-accuracy comparison has less pulse counting, so the time for a single comparison is shorter.

For example, suppose that one of the aforementioned clock signal generating units 215 is such that the frequency of the first clock signal generated changes from 16 MHz to 40 MHz through changes in the impressed voltage in 1,200 steps (in other words, 1,200 changes in the setting values set in the D/A 213), and suppose that the other of the aforementioned clock signal generating units 215 is such that the frequency of the first clock signal changes from 16 MHz to 40 MHz through changes in the impressed voltage in 800 steps (in other words, 800 changes in the setting values set in the D/A 213).

Here, the number of changes of the impressed voltage in Process A is set short so that the successively changing frequency of the first clock signal does not pass the target frequency, and when this is 780 times (in other words, changes in the impressed voltage in 780 steps), let us consider the frequency transition time when the frequency of the first clock signal is changed from 16 MHz to 40 MHz. This frequency transition time is ($\frac{1}{32}$ kHz×780 steps)+($\frac{1}{32}$ kHz×1,024 clock divisions×20 steps)=0.7 second in the clock signal generating unit 215 having 800 steps (the other clock signal generating unit 215), and is ($\frac{1}{32}$ kHz×780)+($\frac{1}{32}$ kHz×1,204 clock divisions×420 steps)=13.5 second with the clock signal generating unit 215 having 1,200 steps (the one clock signal generating unit 215), yielding a time difference of more than 10 seconds.

Next, in the present embodiment, let us consider the frequency transition time in the case of changing the frequency of the first signal clock from 16 MHz to 40 MHz by Process A and the high-accuracy comparison (in other words, the pulse of the second clock signal). In this case, as described above, in low-accuracy comparison the first setting number and the second setting number are $\frac{1}{16}$ as much as in the case of high-accuracy comparison. Furthermore, the number of times the impressed voltage changes in Process A is 500 times (in other words, a 500-step change of the impressed voltage). In this case, the frequency transition time is ($\frac{1}{32}$ kHz×500 steps)+($\frac{1}{32}$ kHz×1,024 division÷16×300 steps)=0.6 second with an 800-step clock signal generating unit 215 (the other clock signal generating unit 215), and is ($\frac{1}{32}$ kHz×500 steps)+($\frac{1}{32}$ kHz×1,024 division÷16×700 steps)=1.4 seconds with a 1,200-step clock signal generating unit 215 (the one clock signal generating unit 215). Consequently, with the composition in the present embodiment, there is little difference between the frequency transition times occurring because of variances in the voltage-frequency characteristics of the clock signal generating units 215. Consequently, it is possible to mitigate variances in the performance of each clock signal generating device 200. Consequently, freedom in design and the range of selection can be broadened for the clock signal generating units 215.

In this embodiment, when the frequency of the first clock signal generated by the clock signal generating unit 215 changes, it is possible to change the frequency in an arbitrary time, so it is possible to prevent sudden changes in the frequency. Consequently, even when the clock signal generating device 200 is built into the CPU, which is the above-described supply destination, it is possible to change the frequency such that no abnormalities occur in the operation of that CPU or the like.

In addition, with the present embodiment even if the frequency of the second clock signal is lowered, it is possible to shorten the above-described frequency transition time, so the effect of reducing power consumption can be obtained by lowering the second clock signal.

In addition, taking into consideration the fact that variances arise in the voltage-frequency characteristics of the clock signal generating unit 215, it is possible to reduce the effect on the frequency transition time even if the number of times the impressed voltage is changed in Process A (the above-described predetermined number of times) is reduced. Furthermore, it is possible to shorten the time until completion of the frequency transition even if the aforementioned predetermined number of times is reduced.

If the frequency of the second clock signal that is the standard is increased, the time needed for frequency transition is reduced but in terms of electronic circuit properties, the higher the frequency, the higher the power consumption. With the clock signal generating device 200 according to the present embodiment, it is possible to shorten the transition time of the frequency of the first clock signal to the target frequency even if the second clock signal is lowered, so it is possible to reduce power consumption by the clock signal generating device 200 by reducing the second clock signal. Furthermore, it is possible to be strong against property variances in the VCO and to increase freedom of design in VCO and the range of selections for VCO.

In addition, with the present embodiment, it is possible to shorten the transition time of the frequency of the first clock signal to the target frequency, so for example it is possible to enlarge the difference between high and low between the two target frequencies and to make one of the target frequencies low. In this case, the effect of reducing power consumption by lowering the frequency of the operating clock of the CPU and the like can be anticipated. Furthermore, with the present embodiment, it is possible to prevent sudden changes in the frequency of the operating clock and to prevent the operation of the CPU and the like from halting, so even when the CPU and the like are waiting in a low power consumption state, monitoring of the clock signal generating unit 215 by the CPU and the like is possible.

The second control unit 203, the clock signal generating unit 215 and the setting unit 211 are at least partially comprised by a PLL, which is an electronic circuit that operates so that the target frequency and the frequency of the clock signal are made to match. The clock signal generating unit 210 is composed of a VCO, for example. In this case, the frequency of the clock signal becomes the oscillation frequency of the VCO. The clock signal generating device 200 can be easily composed using existing PLL and the like.

The clock signal generating device 200 according to the present embodiment comprises an electronic device along with a processing device to which the clock signal generated by this device is supplied and the supplied clock signal is used as the operating clock signal. This electronic device is a computer control part, various types of computers or various types of printers 900 (printing devices). With the present embodiment, an example was illustrated in which a printer 900 was utilized as the electronic device. The composition of the printer 900 is the same as the composition of the printer 900 shown in FIG. 10 other than that the clock signal generating device 200 is used in place of the clock signal generating device 100.

Figure 10:
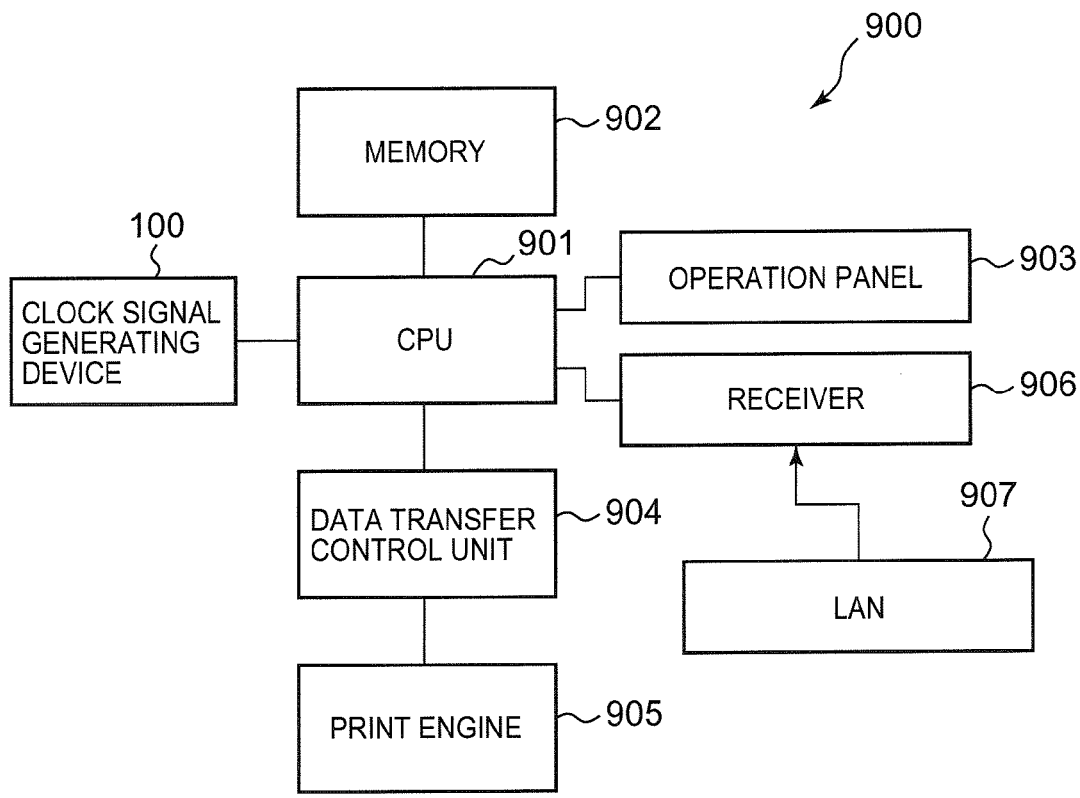
FIG. 10 is a drawing explaining the composition of a printer according to the first embodiment of the present invention.

The composition of the printer 900 is explained simply with reference to FIG. 10.

The printer has, for example, the clock signal generating device 200, a CPU 901, a memory 902, a data transfer control unit 904, a print device engine 905, an operation panel 903 and a receiver 906, and is connected to a LAN 907 (Local Area Network).

The CPU 901 controls the various constituent elements of the printer 900. The CPU 901 operates on the basis of program instructions in the memory 902.

Various types of data, such as the aforementioned programs, printing data and the like, are stored in the memory 902.

The data transfer control unit 904 successively requests part of the print data from the CPU 901 (for example, data for a series of pixels in the image) when printing starts. The CPU 901, in accordance with these requests, reads part of the print data from the memory 902 and supplies this to the data transfer control unit 904. The data transfer control unit 904 successively changes part of the print data to a preset control signal and successively supplies this to the print engine 905.

The print engine 905 has various types of printer heads, print drums and the like, and prints an image expressing the aforementioned print data on paper or the like on the basis of the control signal supplied from the data transfer control unit 904.

The operation panel 903 displays an operation screen, receives operations from the user and supplies operation signals corresponding to the received operations to the CPU 901. The CPU 901 accomplishes predetermined processes in accordance with the supplied operation signals.

Predetermined print data is supplied from the LAN 907. The print data supplied from the LAN 907 is supplied to the printer 900 via a receiver 906, and the CPU 901 stores this data in the memory 902.

The clock signal generating device 200 generates a first clock signal and supplies the generated first clock signal to the CPU 901. The CPU 901 uses this clock signal as an operating clock. The CPU 901 supplies a first control signal specifying target frequencies to the clock signal generating device 200. By supplying the first control signal to the clock signal generating device 200, the target frequency is set in the clock signal generating device 200. The clock signal generating device 200 operates so as to generate and output a clock signal for the set target frequency. In this manner, the CPU 901 designates the frequency of the clock signal.

When printing or the like is not undertaken, the printer 900 is in a sleep state (print standby state). At this time, the CPU 901 halts operation of the data transfer control unit 904 and the like, reducing the power consumption of the printer 900. The frequency of the operating clock of the CPU 901 at this time need not be high, so the CPU 901 requests a low target frequency (for example, 16 MHz as mentioned above) from the clock signal generating device 200. In other words, the CPU 901 supplies the first control signal specifying 16 MHz to the clock signal generating device 200. Through this, the clock signal generating device 200 operates so as to generate and output a 16 MHz clock signal.

When the printer 900 is in a sleep state, the CPU 901 constantly receives operations from the operation panel 903 or print data supplied from the LAN 907 via the receiver 906.

When the operation panel 903 is operated or print data is supplied from the LAN 907, the printer enters an operating state and begins printing. At this time, the CPU 901 causes the data transfer control unit 904 and the like to operate, so it is necessary for the frequency of the operating clock to be high. Consequently, the CPU 901 requests a high target frequency (for example, 40 MHz as mentioned above) from the clock signal generating device 200. In other words, the CPU 901 supplies the first control signal specifying 40 MHz to the clock signal generating device 200. Through this, the clock signal generating device 200 operates so as to generate and output a 40 MHz clock signal When the printer is in an operating state, the CPU 901 instructs the data transfer control unit 904 to begin printing, and the data transfer control unit 904 successively requests part of the print data from the CPU 901 with the start of printing. Through this, printing is started.

The transition from sleep state to operating state in the printer 900 is preferably accomplished in a short time. Furthermore, instability in (including stopping of) operation of the CPU 901 and the like should naturally be avoided. When the CPU 901 becomes unstable during printing, the necessity of restarting the printer arises. As a result of restarting, loss of printing data during printing can arise, and in some cases printing many not proceed well.

By using the clock signal generating device 200 according to the present embodiment in the printer 900, as discussed above when the target frequency is changed it is possible with this clock signal generating device 200 to cause the frequency of the first clock signal to become or approach the target frequency in a short time without causing instability in the operation of the CPU 901 or the like, or minimizing instability. Consequently, loss of printing data by this printer 900 during printing can be prevented or mitigated. In addition, because it is possible for the frequency of the first clock signal to become or approach the target frequency in a short time, the CPU 901 can return to the operating state promptly even when operating under a clock signal of low frequency when in the sleep state. Consequently, it is possible to adopt a low frequency as the target frequency of the clock signal during the sleep state and through this to reduce poser consumption by the printer 900 in the sleep state.

The clock signal generating device 200 according to the present embodiment is not limited to a printer 900, but can be used in a computer or other electronic device that can assume difference states such as an operating state and a standby state. With an electronic device that utilizes the clock signal generating device 200 according to the present embodiment, the same effects as described above (eliminating or mitigating data loss and instability of the CPU 901 and the like, quick return to operating state, reduction of power consumption and so forth) can be obtained.

The present invention is not limited to the above-described embodiment, for a variety of variations is possible. Examples of these are illustrated below. Even with the below variations, the effects explained above can be obtained.

(1) The clock signal generating unit 210 may increase the frequency of the generated clock signal in accordance with reduction of the impressed voltage. In this case, handling of increases and decreases in the impressed voltage would be reversed.

(2) The setting unit 211 may reduce the voltage impressed on the clock signal generating unit 210 as the set control value becomes larger. In this case, handling of the control value and the impressed voltage would be reversed.

(3) In the above-described embodiment, the first control unit 201 controls the voltage impressed on the clock signal generating unit 210 via the setting unit 211, but the first control unit 201 may directly control the voltage impressed on the clock signal generating unit 210.

(4) In the above-described embodiment, the second control unit 203 controls the voltage impressed on the clock signal generating unit 210 via the setting unit 211, but the second control unit 203 may directly control the voltage impressed on the clock signal generating unit 210.

(5) The setting unit 211 changes the control value one by one, but it would be fine to change the control value by a value of two or more (a value larger than the smallest unit value the control value takes). Through this, the first control unit 201 can more quickly get the frequency of the first clock signal to approach the target frequency. However, as the change value of the control value becomes large, the change in the frequency of the first clock signal also becomes larger, but if the change in the frequency becomes large, this could have adverse effects on the supply destinations of the first clock signal. Consequently, what value to change the setting value with when the setting value is changed with a value of two or more is determined based on the supply destinations of the clock signal.

(6) The method of having the first control unit 201 continue to periodically change the voltage value of the impressed voltage in place of the second control unit 203 and the method of setting the setting numbers in each counter may be methods other than those above.

(7) In addition, the number of changes when the first control unit 201 continues to periodically change the voltage value of the impressed voltage in place of the second control unit 203 may differ between the case of the target frequency transitioning from 40 MHz to 16 MHz and the case of the target frequency transitioning from 16 MHz to 40 MHz.

(8) In addition, the target frequencies are not limited to the above frequencies and in addition there may be three or more target frequencies. In this case, the first control signal is also a signal that can specify each frequency. In addition, candidates for the first setting number set in the first counter 205 and candidates for the second setting number set in the second counter 207 are not limited to the above.

(9) Furthermore, the frequency of the second clock signal was explained as 32 kHz above in order to facilitate understanding, but in reality this is 32.768 kHz or the like. In this case, various values for the target frequencies, candidates for the first setting number and candidates for the second setting number are changed to be compatible with this frequency.

(10) The relationship between the first setting number and the second setting number in the low-accuracy comparison and the first setting number and the second setting number in the high-accuracy comparison need not be $\frac{1}{16}$, nor need this be 2.

Figure 12:
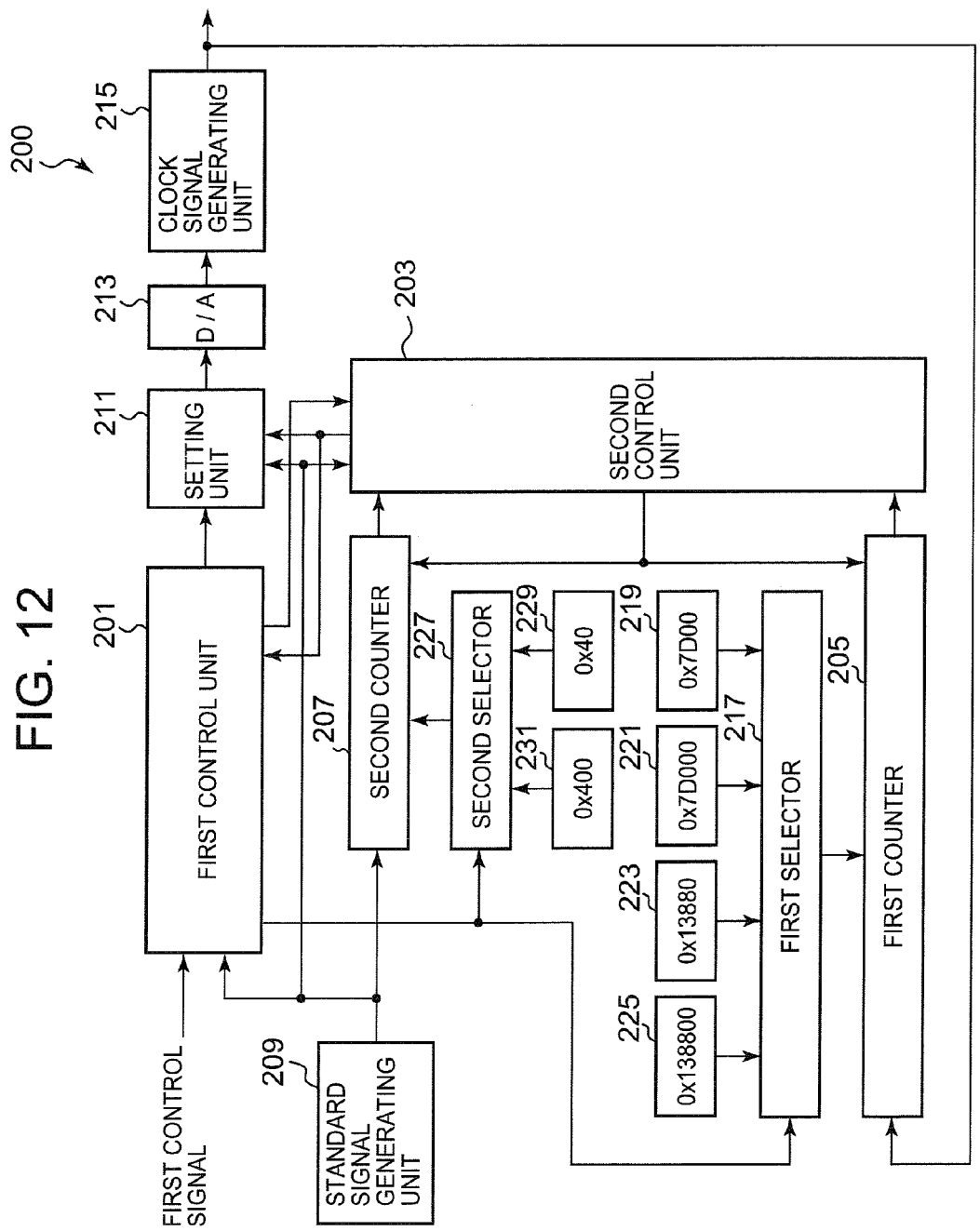
FIG. 12 is a drawing explaining the composition of the clock signal generating device according to a second embodiment of the present invention.

(11) In FIG. 12, the candidates for the first setting number and the candidates for the second setting number are respectively managed by separate registers, but it would be fine to have a structure such that the first control unit 201 or the like seek candidates for the first setting number and candidates for the second setting number used in low-accuracy comparison through shifts and computations based on the register value of candidates for the first setting number and candidates for the second setting number used in high-accuracy comparison. The first control unit 201 may set the values found in the first counter 205 and the second counter 207, respectively. In addition, conversely the registers of low-accuracy comparison may be shifted and take the place of the registers of high-accuracy comparison. In this way, the number of registers may be reduced and economizing realized.

Figure 19:
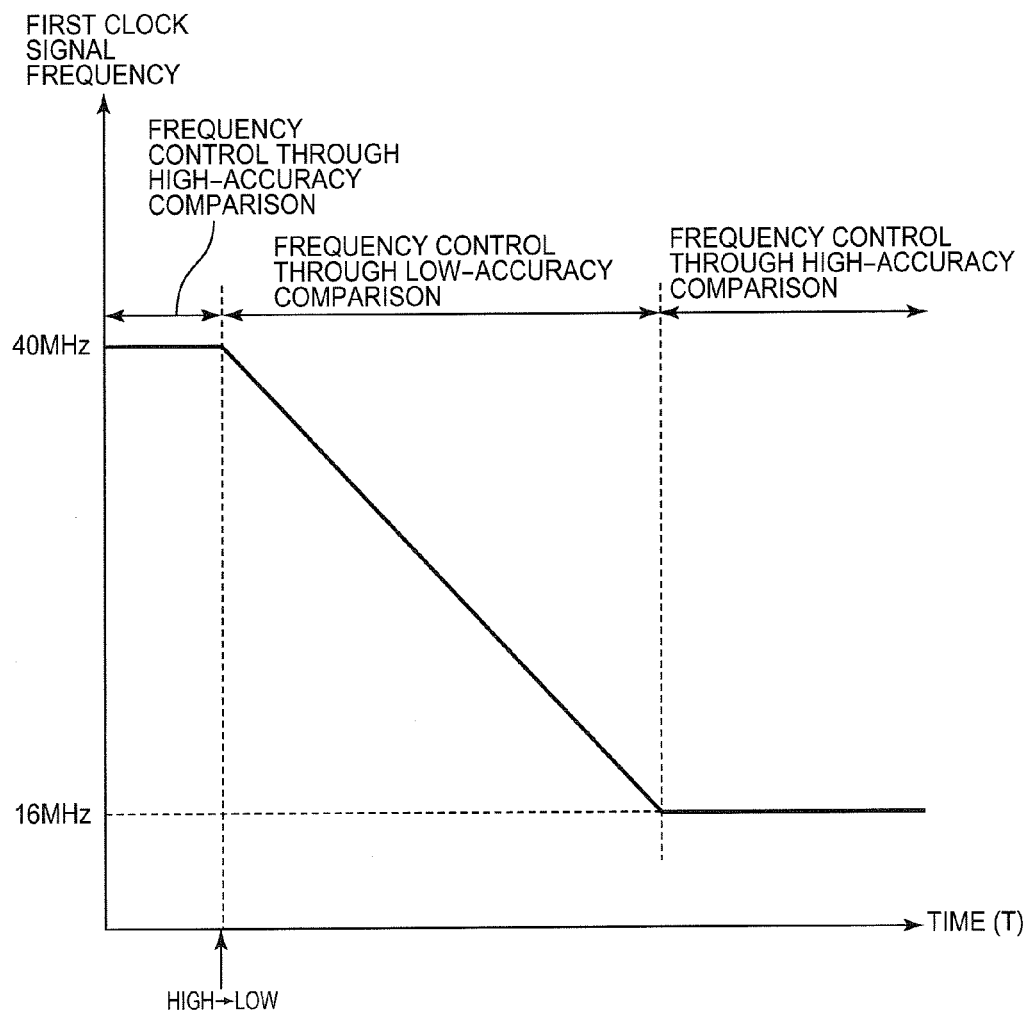

(12) It would also be fine to not accomplish the process wherein the first control unit 201 continues to periodically change the voltage value of the impressed voltage in place of the second control unit 203. In other words, for example as shown in FIG. 19, when the target frequency is changed, the first control unit 201 may set the above-described fifth number and the above-described sixth number in the first counter 205 and the second counter 207, respectively, and the second control unit 203 may immediately accomplish the voltage control process through low-accuracy comparison (subsequent processes being the same as above). In this case, the first control unit 201 need not appropriately control the setting unit 211 and the second control unit 202. In this case, for example in the flow in FIG. 16, the processes of steps S503 to S506 and steps S511 to S514 become unnecessary.

With the clock signal generating device 200 according to the present invention and an electronic device provided with this clock signal generating device 200, it is possible to cause the frequency of the generated clock signal to match the target frequency in a short time even if the target frequency is changed.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A clock signal generating device in which a target frequency is set, comprising:

a clock signal generating unit on which a voltage is successively impressed, and which successively generates a clock signal having a frequency corresponding to the successively impressed voltage;

a first control unit that compares the target frequency and the frequency of the clock signal generated by the clock signal generating unit and, based on a result of the comparison, controls the voltage impressed on the clock signal generating unit so that the frequency of the clock signal becomes the target frequency; and a second control unit that, when the target frequency changes, performs control in place of the first control unit to successively change the voltage impressed on the clock signal generating unit by a preset change value and a preset interval within a preset time to cause the frequency of the clock signal to approach the target frequency;

wherein the preset change value is constant and independent of the frequency of the clock signal generated by the clock signal generating unit.

2. The clock signal generating device according to claim 1, wherein when the change in the target frequency is an increasing change that causes the target frequency to increase, the second control unit successively changes the voltage so that the frequency of the clock signal increases to the target frequency.

3. The clock signal generating device according to claim 1, wherein when the change in the target frequency is a decreasing change that causes the target frequency to decrease, the second control unit successively changes the voltage so that the frequency of the clock signal decreases to the target frequency.

4. The clock signal generating device according to claim 1, wherein the first control unit:

controls the voltage impressed on the clock signal generating unit to lower the frequency of the clock signal when the target frequency is lower than the frequency of the clock signal; and controls the voltage impressed on the clock signal generating unit to raise the frequency of the clock signal when the target frequency is higher than the frequency of the clock signal.

5. The clock signal generating device according to claim 1, further comprising:

a voltage impressing unit in which a predetermined control value is set and which impresses a voltage corresponding to the set control value on the clock signal generating unit;

wherein the second control unit successively changes the voltage impressed on the clock signal generating unit by causing the control value set in the voltage impressing unit to change by a value that is larger than a value of the smallest unit that the control value can take.

6. The clock signal generating device according to claim 1, wherein:

the clock signal generating unit is a VCO (Voltage Controlled Oscillator); and the clock signal generating unit and the first control unit constitute at least part of a PLL (Phase Locked Loop).

7. The clock signal generating device according to claim 1, wherein the first control unit performs control of the voltage using the post-change target frequency after the second control unit has successively changed the voltage impressed on the clock signal generating unit within the preset time.

8. The clock signal generating device according to claim 1, wherein the preset interval is constant and independent of the frequency of the clock signal generated by the clock signal generating unit.

9. The clock signal generating device according to claim 1, wherein the preset time is constant and independent of the frequency of the clock signal generated by the clock signal generating unit.

10. An electronic device, comprising:

the clock signal generating device according to claim 1; and a processing device that uses the clock signal generated by the clock signal generating unit in the clock signal generating device.

11. A clock signal generating device, comprising:

a PLL (Phase Locked Loop) provided with a VCO (Voltage Controlled Oscillator) on which a voltage is successively impressed and which successively outputs a clock signal whose frequency corresponds to the successively impressed voltage; and a control unit to which a specifying signal specifying a target frequency of the clock signal is supplied;

wherein when the target frequency is changed by the supplied specifying signal, the control unit performs control in place of the PLL to successively change the voltage impressed on the VCO by a predetermined change value and a predetermined interval in a predetermined time to cause the frequency of the clock signal to approach the target frequency; and wherein the predetermined chancre value is constant and independent of the frequency of the clock signal generated by the VCO.

12. The clock signal generating device according to claim 11, wherein the predetermined interval is constant and independent of the frequency of the clock signal generated by the VCO.

13. The clock signal generating device according to claim 11, wherein the predetermined time is constant and independent of the frequency of the clock signal generated by the VCO.

14. A clock signal generating device comprising:

a clock signal generating unit that generates a first clock signal having a frequency corresponding to a voltage value of an impressed voltage;

a first counter that counts pulses of the first clock signal generated by the clock signal generating unit up to a first setting number that has been set;

a second counter that counts pulses of a second clock signal that is a standard up to a second setting number that has been set;

a first control unit that, when a target frequency is set, sets the first setting number and the second setting number in the first counter and the second counter, respectively, in accordance with the target frequency that has been set; and a second control unit that successively performs a voltage control process by causing counting by the first counter and the second counter to start, comparing a timing at which counting up to the first setting number ends in the first counter and a timing at which counting up to the second setting number ends in the second counter, and controlling the voltage value of the voltage impressed on the clock signal generating unit in accordance with a result of the comparison;

wherein the first setting number and the second setting number are numbers such that when the frequency of the first clock signal is the target frequency, the first counter and the second counter simultaneously finish counting after simultaneously starting to count; and wherein the first control unit:

sets a first number in the first counter as the first setting number and sets a second number in the second counter as the second setting number when the set target frequency is a first target frequency;

sets a third number in the first counter as the first setting number and sets a fourth number in the second counter as the second setting number when the set target frequency is a second target frequency; and when the set target frequency is changed from the first target frequency to the second target frequency, (i) at a first predetermined timing, sets a fifth number smaller than the third number in the first counter as the first setting number and sets a sixth number smaller than the fourth number in the second counter as the second setting number, and (ii) at a second predetermined timing after the first predetermined timing, sets the third number in the first counter and sets the fourth number in the second counter.

15. The clock signal generating device according to claim 14, wherein:

when the target frequency is changed from the first target frequency to the second target frequency, the first control unit performs control in place of the second control unit to cause the frequency of the first clock signal to approach the second target frequency by continuing to cause the voltage value of the voltage impressed on the clock signal generating unit to periodically change at predetermined intervals and a predetermined number of times; and when the first control unit finishes causing the frequency of the first clock signal to approach the second target frequency, the second control unit performs control in place of the first control unit to successively perform the voltage control process using the first counter in which the fifth number has been set and the second counter in which the sixth number has been set.

16. The clock signal generating device according to claim 14, wherein when the frequency of the first clock signal changing through the voltage control process successively performed using the first counter in which the fifth number is set and the second counter in which the sixth number is set has reached the second target frequency, the first control unit sets the third number in the first counter and sets the fourth number in the second counter.

17. The clock signal generating device according to claim 16, wherein:

the second control unit accomplishes control through a control method that either raises, maintains or lowers the voltage value of the voltage impressed on the clock signal generating unit in accordance with the result of the comparison; and the first control unit detects that the frequency of the first clock signal has reached the second target frequency by detecting that the control method of the second control unit has changed.

18. The clock signal generating device according to claim 14, wherein the fifth number and the sixth number are numbers obtained by dividing the third number and the fourth number by a preset number respectively.

19. The clock signal generating device according to claim 14, wherein the second number and the fourth number are the same number.

20. An electronic device comprising:

the clock signal generating device according to claim 14; and a processing device that uses the first clock signal generated by the clock signal generating unit in the clock signal generating device.

21. A printer comprising:

the clock signal generating device according to claim 14;

a processing device that uses the first clock signal generated by the clock signal generating unit in the clock signal generating device, and that processes image data; and a print engine which prints images corresponding to the image data processed by the processing device.

\* \* \* \* \*

UNITED STATES PATENT AND TRADEMARK OFFICE
CERTIFICATE OF CORRECTION

| | | |
|---|---|---|
| PATENT NO. | : 8,612,794 B2 | Page 1 of 1 |
| APPLICATION NO. | : 12/957667 | |
| DATED | : December 17, 2013 | |
| INVENTOR(S) | : Jun Kojima | |

It is certified that error appears in the above-identified patent and that said Letters Patent is hereby corrected as shown below:

In the Claims:

Column 52, Line 30 (Claim 11, Line 16):

delete "chancre" and insert --change--.

Signed and Sealed this
Twenty-seventh Day of May, 2014

Michelle K. Lee
*Deputy Director of the United States Patent and Trademark Office*